US008729221B2

(12) United States Patent
Bazan et al.

(10) Patent No.: US 8,729,221 B2
(45) Date of Patent: May 20, 2014

(54) CONJUGATED COPOLYMERS CHIRAL SIDE CHAIN FOR ORGANIC THIN FILM TRANSISTORS

(71) Applicant: The Regents of the University of California, Oakland, CA (US)

(72) Inventors: Guillermo C. Bazan, Goleta, CA (US); Lei Ying, Goleta, CA (US); Peter Zalar, Thousand Oaks, CA (US); Thuc-Quyen Nguyen, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/869,533

(22) Filed: Apr. 24, 2013

(65) Prior Publication Data

US 2013/0331530 A1 Dec. 12, 2013

Related U.S. Application Data

(60) Provisional application No. 61/638,310, filed on Apr. 25, 2012.

(51) Int. Cl.
*C08G 75/00* (2006.01)

(52) U.S. Cl.
USPC ........... 528/377; 528/378; 528/370; 528/380; 526/257

(58) Field of Classification Search
CPC ............................................... C08G 2261/3243
USPC .................... 528/377, 378, 370, 380; 526/257
See application file for complete search history.

(56) References Cited

PUBLICATIONS

Perez et al., Proceedings Published 2012 by the American Chemical Society, Mar. 2012.*

* cited by examiner

*Primary Examiner* — Shane Fang
(74) *Attorney, Agent, or Firm* — Gates & Cooper LLP

(57) ABSTRACT

Embodiments of the invention include polymers comprising a regioregular conjugated main chain section having an enantiopure or enantioenriched chiral side chain, as well as methods and materials for producing such polymers. Illustrative methods include regioselectively preparing a monomer that includes an enantiopure or enantioenriched chiral side group, and then reacting these monomers to produce a polymer that comprises a regioregular conjugated main chain section having an enantiopure or enantioenriched chiral side chains. In illustrative embodiments of the invention, the regioregular conjugated main chain section can contain a repeat unit that includes a dithiophene and a pyridine.

20 Claims, 17 Drawing Sheets

CONJUGATED COPOLYMERS CHIRAL SIDE CHAIN FOR ORGANIC THIN FILM TRANSISTORS

REFERENCE TO RELATED APPLICATIONS

This application claims the benefit under 35 U.S.C. Section 119(e) of U.S. Provisional Patent Application Ser. No. 61/638,610, filed on Apr. 25, 2012, entitled "CONJUGATED COPOLYMERS CHIRAL SIDE CHAIN FOR ORGANIC THIN FILM TRANSISTORS" the contents of which are incorporated herein by reference.

TECHNICAL FIELD

The invention relates to conjugated polymers and methods of making and using them.

BACKGROUND OF THE INVENTION

A new generation of electronic devices including light-emitting diodes, field-effect transistors and photovoltaic cells as organic photovoltaics (OPVs) and organic light-emitting transistors (OLETs) is being fabricated using organic semiconductors as their active components. Conjugated polymer are useful in these devices as they combine the electrical properties of semiconductors with the mechanical properties of plastics. Moreover, these materials can be processed inexpensively by techniques such as spin-coating and ink jet printing. For this reason, they are finding applications in optoelectronic devices such as plastic light-emitting diodes (LEDs) and photovoltaic cells. Because conjugated polymers can be designed to form active layers in these types of electronic devices, these polymers provide promising materials for optimizing the performance of existing devices as well as the development of new devices.

It is known that utilizing branched alkyl side chains in conjugated polymers, especially donor-acceptor conjugated polymers, is an effective method for improving the solubility of conjugated polymers as the side chain bulkiness efficiently reduces interchain interactions. However, branched alkyl side chains may have unsymmetric carbon centers which impart variation in configuration due to chirality. Little attention has been paid to the potential influence of alkyl side chain chirality on organic semiconductor performance.

SUMMARY

The invention disclosed herein includes polymers formed from enantioenriched or enanantiopure monomers which exhibit selected optical and/or electrical properties. In illustrative embodiments of the invention, regioregular D-A type conjugated polymers formed from these monomers are shown to exhibit a greater charge carrier mobility than that observed in analogous polymers formed without using enantioenriched or enanantiopure monomers. Conjugated polymers having the optical and/or electrical properties disclosed are useful in a wide variety of applications.

The invention disclosed herein has a number of embodiments. One illustrative embodiment of the invention is a regioregular D-A type conjugated polymer having a main chain comprising a repeat unit including a dithiophene of the formula:

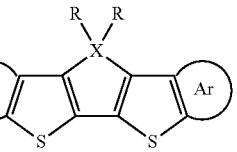

and a pyridine of the formula:

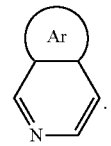

In such embodiments, each Ar is independently nothing or a substituted or non-substituted aromatic functional group, each R is independently nothing or an enantiopure or enantioenriched substituted or non-substituted chiral alkyl or chiral alkoxy chain, and X is C, Si, Ge, N or P.

In some embodiments of the invention, substituted or non-substituted aromatic functional groups on the regioregular conjugated polymer can include one or more alkyl chains. For example, in certain embodiments of the invention, the one or more alkyl chains are each independently a $C_6$-$C_{30}$ substituted or non-substituted alkyl chain, —$(CH_2CH_2O)n$ (n=2-20), $C_6H_5$, —$C_nF_{(2n+1)}$ (n=2-20), —$(CH_2)_nN(CH_3)_3Br$ (n=2-20), or —$(CH_2)_nN(C_2H_5)_2$ (n=2-20). Optionally for example, an enantiopure or enantioenriched substituted or non-substituted chiral alkyl or alkoxy chain is a $C_6$-$C_{30}$ substituted or non-substituted chiral alkyl or alkoxy chain, or enantiopure or enantioenriched (S)-2-methylbutyl, (S)-2-ethylhexyl, (S)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl.

Embodiments of the invention can utilize a variety of reagents. For example, in certain embodiments of the invention, the pyridine unit is of the following formula:

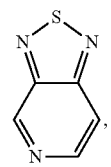

and the dithiophene unit is of the following formula

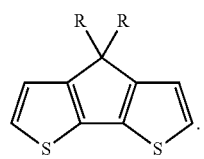

Optionally, the conjugated main chain of the regioregular conjugated polymer comprises a repeat unit of the following formula:

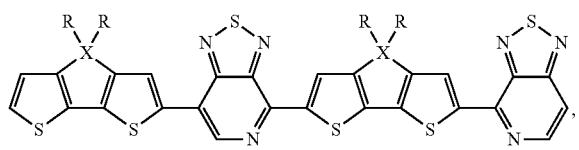

wherein each R is independently nothing or an enantiopure or enantioenriched substituted or non-substituted chiral alkyl or alkoxy chain, and X is C, Si, Ge, N or P. In certain embodiments of the invention, this repeat unit has the following formula:

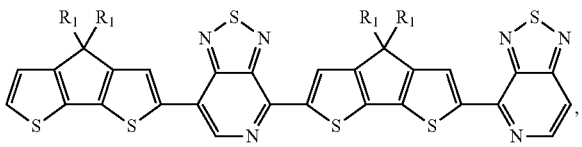

wherein each $R_1$ is independently nothing or an enantiopure or enantioenriched substituted or non-substituted chiral alkyl or alkoxy chain.

Embodiment of the invention include methods for forming a regioregular conjugated polymer that is useful in organic semiconductor films. Typically, these methods comprise the steps of forming a regioregular conjugated polymer by selecting monomers comprising an enantiopure or enantioenriched chiral side groups, wherein the monomers are selected to form a donor-acceptor conjugated polymer comprising a plurality of donor repeating units and a plurality of acceptor repeating units; and then performing a polymerization reaction on the monomers so as to produce a polymer that comprises a regioregular conjugated main chain section having enantiopure or enantioenriched chiral side chains. In some embodiments of the invention, the method comprises regioselectively preparing the monomers prior to the polymerization reaction. Optionally, for example, regioselectively preparing the monomers comprises reacting halogen-functionalized thiadiazolo[3,4-c]pyridine with organotin-functionalized cyclopenta[2,1-b:3,4-b']dithiophene comprising an enantiopure or enantioenriched chiral side group. In specific illustrative embodiments of the invention, the organotin-functionalized cyclopenta[2,1-b:3,4-b']dithiophene has the following formula:

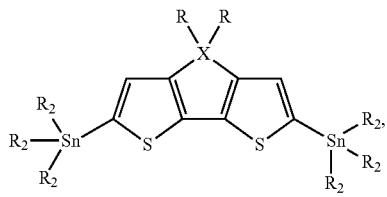

wherein each R is independently nothing or an enantiopure or enantioenriched substituted or non-substituted chiral alkyl or alkoxy chain, each $R_2$ is independently methyl or n-butyl, and X is C, Si, Ge, N or P.

In illustrative methodological embodiments of the invention, the monomer can comprise the formula:

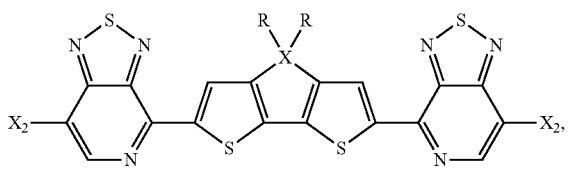

wherein each R is independently nothing or an enantiopure or enantioenriched substituted or non-substituted chiral alkyl or alkoxy chain, X is C, Si, Ge, N or P, and each $X_2$ independently comprises a halogen. Optionally, for example, the monomer has the following formula:

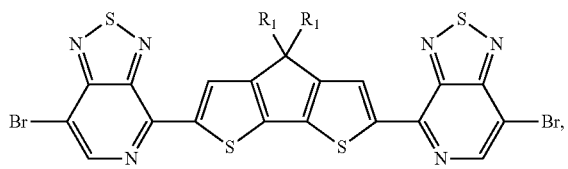

wherein each $R_1$ is independently nothing or an enantiopure or enantioenriched substituted or non-substituted chiral alkyl or alkoxy chain.

Yet another embodiment of the invention is a device comprising a composition of matter that includes a regioregular conjugated polymer having a main chain comprising a repeat unit including a dithiophene of the formula:

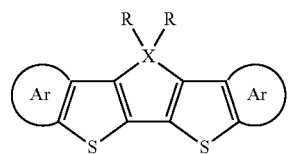

and a pyridine of the formula:

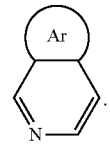

In such embodiments, each Ar is independently nothing or a substituted or non-substituted aromatic functional group, each R is independently nothing or an enantiopure or enantioenriched substituted or non-substituted chiral alkyl or chiral alkoxy chain, and X is C, Si, Ge, N or P. In addition, in these embodiments of the invention, the polymer forms a donor-acceptor type conjugated polymer including a plurality of donor repeating units and a plurality of acceptor repeating units. Typically in these devices, this composition forms an active semiconducting layer.

Embodiments of the invention include devices designed to include the regioregular conjugated polymers selected for specific optical or electrical properties. In certain embodiments of the invention, a device can use regioregular conjugated polymers of the invention that are selected for their ability to modulate charge carrier mobility. In some embodiments of the invention, the device is formed from elements including a regioregular conjugated polymer having a charge carrier mobility that is greater than the charge carrier mobility of a polymer of similar regioregular composition but having a racemic substituted or non-substituted chiral alkyl or alkoxy chain. In other embodiments of the invention, the device is formed from elements including a regioregular conjugated polymer that exhibits an electron hole mobility that is at least 10% greater than the electron hole mobility of a control regioregular conjugated polymer, one that is formed from monomers wherein R is not an enantiopure or enantioenriched substituted or non-substituted chiral alkyl or chiral alkoxy chain. Optionally, in such embodiments, the device is a field effect transistor, organic photovoltaic device, polymer light emitting diode, organic light emitting diode, organic photodetector, or biosensor.

Yet another embodiment of the invention is a polymerization system comprising enantiopure or enantioenriched monomers useful to form a regioregular conjugated polymer of the invention. In certain embodiments, the polymerization system includes a solvent and/or a reaction vessel in which the monomers and other reagents can be combined. Optionally, the polymerization system is in the form of a kit, for example one including a plurality of containers that the combination of reagents used to form the regioregular conjugated polymer of the invention.

BRIEF DESCRIPTION OF THE DRAWINGS

For a more complete understanding of the present invention, reference is now made to the following descriptions taken in conjunction with the accompanying drawings.

DETAILED DESCRIPTION

Figure 1A:
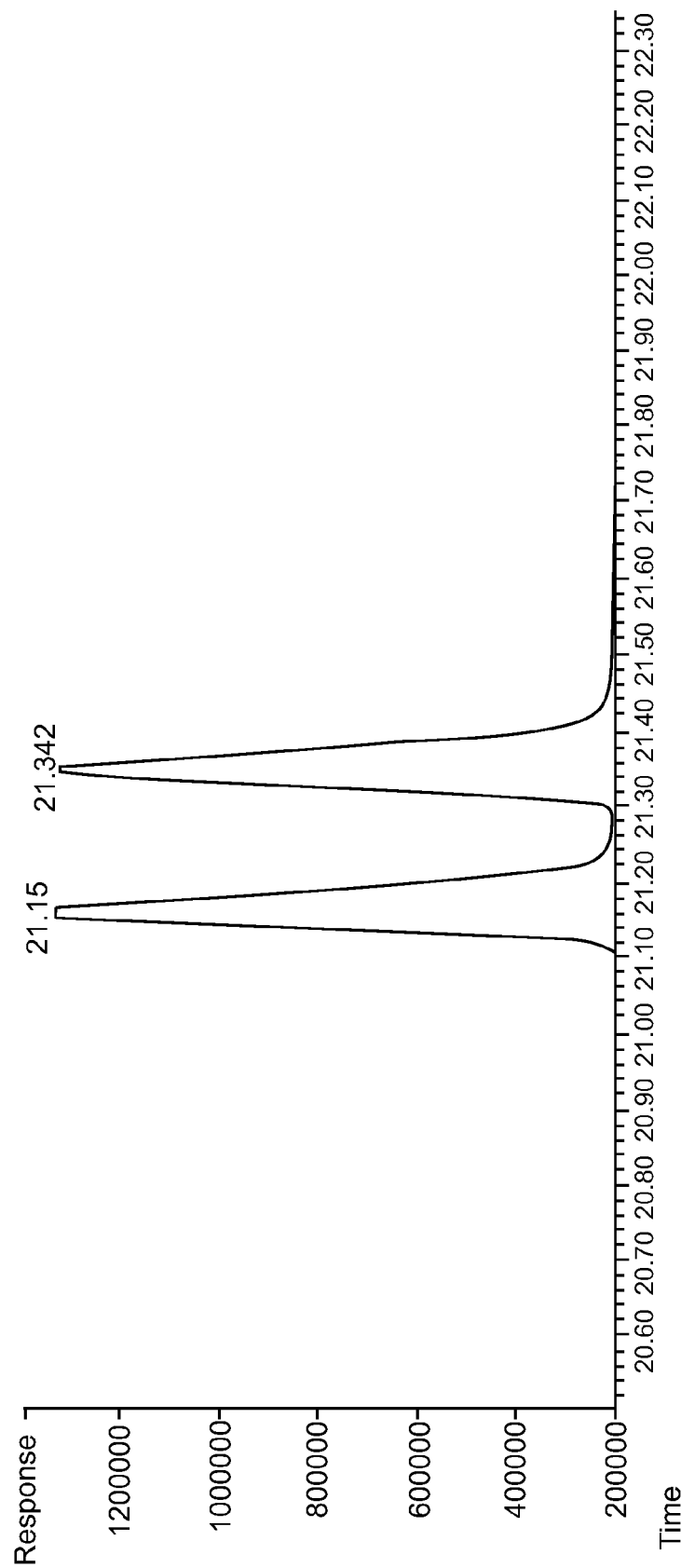
FIG. 1 is a panel of profiles of (a) chiral GC of racemic 2-ethylhexylbromide, and (b) chiral GC of (S)-2-ethylhexylbromide (M2).

Unless otherwise defined, all terms of art, notations and other scientific terms or terminology used herein are intended to have the meanings commonly understood by those of skill in the art to which this invention pertains. In the description of illustrative embodiments, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Conjugated polymers are organic macromolecules which consist at least of one backbone chain of alternating double and single-bonds. Due to the fact that the $p_z$-orbitals of the carbon atoms which form the π-orbitals of the alternating double- and single-bonds mesomerize more or less, i.e. the single and double bonds becomes similar, double-bonds overlap also over the single bonds. Moreover, the π-electrons can be easier moved from one bond to the other, making conjugated polymers one-dimensional semiconductors. As discussed below, polymers formed from monomers selected for their chiral profiles are observed to exhibit selected functional properties. Conjugated polymers having these properties are useful in a variety of organic electronic applications.

Terms in this description are used in accordance with their art accepted meaning. For example, the term "alkyl" refers to a branched or unbranched saturated hydrocarbyl group. The term "alkoxy" refers to an alkyl group bound through a single, terminal ether linkage. The term "substituted" refers to a hydrocarbyl, alkoxy or aromatic group in which one or more bonds to a hydrogen atom contained within the group is replaced by a bond to a non-hydrogen atom of a substituent group. Examples of non-hydrogen atoms include, but are not limited to, carbon, oxygen, nitrogen, phosphorus, and sulfur. Examples of substituent groups include halo, hydroxy, amino, alkoxy, aryloxy, nitro, ester, amide and hydrocarbyl groups. The substituent can be a functional group such as hydroxyl, alkoxy, thio, phosphino, amino, or halo.

The term "enantiopure" means that only one of the two corresponding enantiomers is present in a substance. The term "enantioenriched" means that one enantiomer is enriched so as to be in excess over the other corresponding enantiomer in a substance. In some embodiments, the enriched enantiomer is 60, 70, 80 or 90% or more of the total of both enantiomers.

The invention disclosed herein includes a number of embodiments of D-A type polymers (see, e.g. Having a et al., Polym. Bull. 1992, 29, 119-126; and Having a et al., Synth, Met. 1993, 55, 299-306). One illustrative embodiment of the invention is a regioregular D-A type conjugated polymer having a main chain comprising a repeat unit including a dithiophene of the formula:

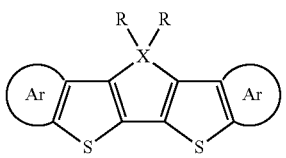

and a pyridine of the formula:

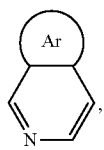

In such embodiments, each Ar is independently nothing or a substituted or non-substituted aromatic functional group, each R is independently nothing or an enantiopure or enantioenriched substituted or non-substituted chiral alkyl or chiral alkoxy chain, and X is C, Si, Ge, N or P. In these embodiments of the invention, the polymer forms a donor-acceptor conjugated polymer including a plurality of donor repeating units and a plurality of acceptor repeating units.

In typical embodiments of the invention, substituted or non-substituted aromatic functional groups on the regioregular conjugated polymer can include one or more alkyl chains. For example, in certain embodiments of the invention, the one or more alkyl chains are each independently a $C_6$-$C_{30}$ substituted or non-substituted alkyl chain, —$(CH_2CH_2O)n$ (n=2-20), $C_6H_5$, —$C_nF_{(2n+1)}$ (n=2-20), —$(CH_2)_nN(CH_3)_3Br$ (n=2-20), or —$(CH_2)_nN(C_2H_5)_2$ (n=2-20). Optionally, an enantiopure or enantioenriched substituted or non-substituted chiral alkyl or alkoxy chain is a $C_6$-$C_{30}$ substituted or non-substituted chiral alkyl or alkoxy chain, or enantiopure or enantioenriched (S)-2-methylbutyl, (S)-2-ethylhexyl, (5)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl.

In certain embodiments of the invention, the pyridine unit is of the following formula:

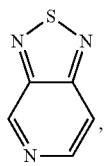

and the dithiophene unit is of the following formula

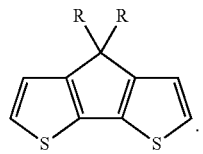

Optionally, the conjugated main chain of the regioregular conjugated polymer comprises a repeat unit of the following formula:

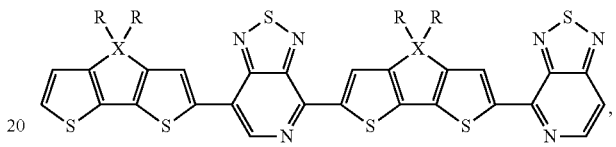

wherein each R is independently nothing or an enantiopure or enantioenriched substituted or non-substituted chiral alkyl or alkoxy chain, and X is C, Si, Ge, N or P. In certain embodiments of the invention, this repeat unit has the following formula:

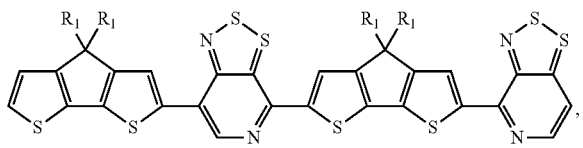

wherein each $R_1$ is independently nothing or an enantiopure or enantioenriched substituted or non-substituted chiral alkyl or alkoxy chain.

Certain embodiments of the regioregular conjugated polymers disclosed herein exhibit selected optical or electrical properties. Optionally, for example, the polymer is formed so that the charge carrier mobility of the polymer is greater than the charge carrier mobility of a polymer of similar regioregularity and composition but having a racemic substituted or non-substituted chiral alkyl or alkoxy chain. In certain embodiments of the invention, the polymer is designed to exhibit one or more selected properties as compared to a control regioregular conjugated polymer wherein R is not an enantiopure or enantioenriched substituted or non-substituted chiral alkyl or chiral alkoxy chain. For example, in some embodiments of the invention, regioregular conjugated polymer exhibits an electron hole mobility that is at least 10%, 25%, 50%, 75%, 100%, 200%, 300% or 400% greater than the electron hole mobility of the control regioregular conjugated polymer. Similarly, in certain embodiments of the invention, the regioregular conjugated polymer exhibits a threshold voltage that is at least 10%, 20%, 25%, 30% or 35% less than the electron hole mobility of the control regioregular conjugated polymer.

Embodiments of the D-A type regioregular conjugated polymers having the above-noted properties can be used to overcome certain problematical aspects of organic electric device technology by enhancing the function(s) of devices in which they are used. For example, a regioregular conjugated polymer of the invention can be designed to have an enhanced electron hole mobility and used in a device in order to modulate current flow through one or more elements of the device, thereby enhancing the performance of the device (e.g. by increasing a speed at which a device initiates/performs its functions). In some embodiments of the invention, a regioregular conjugated polymer designed to have a selected threshold voltage is used in a device in order to modulate a threshold voltage of one or more elements of the device, thereby enhancing the performance of the device (e.g. by selectively modulating one or more electronic thresholds at which a device initiates/performs its functions). In this way, the regioregular conjugated polymers can overcome certain technical challenges that relate to device electron mobility and/or voltage threshold.

Figure 10A:
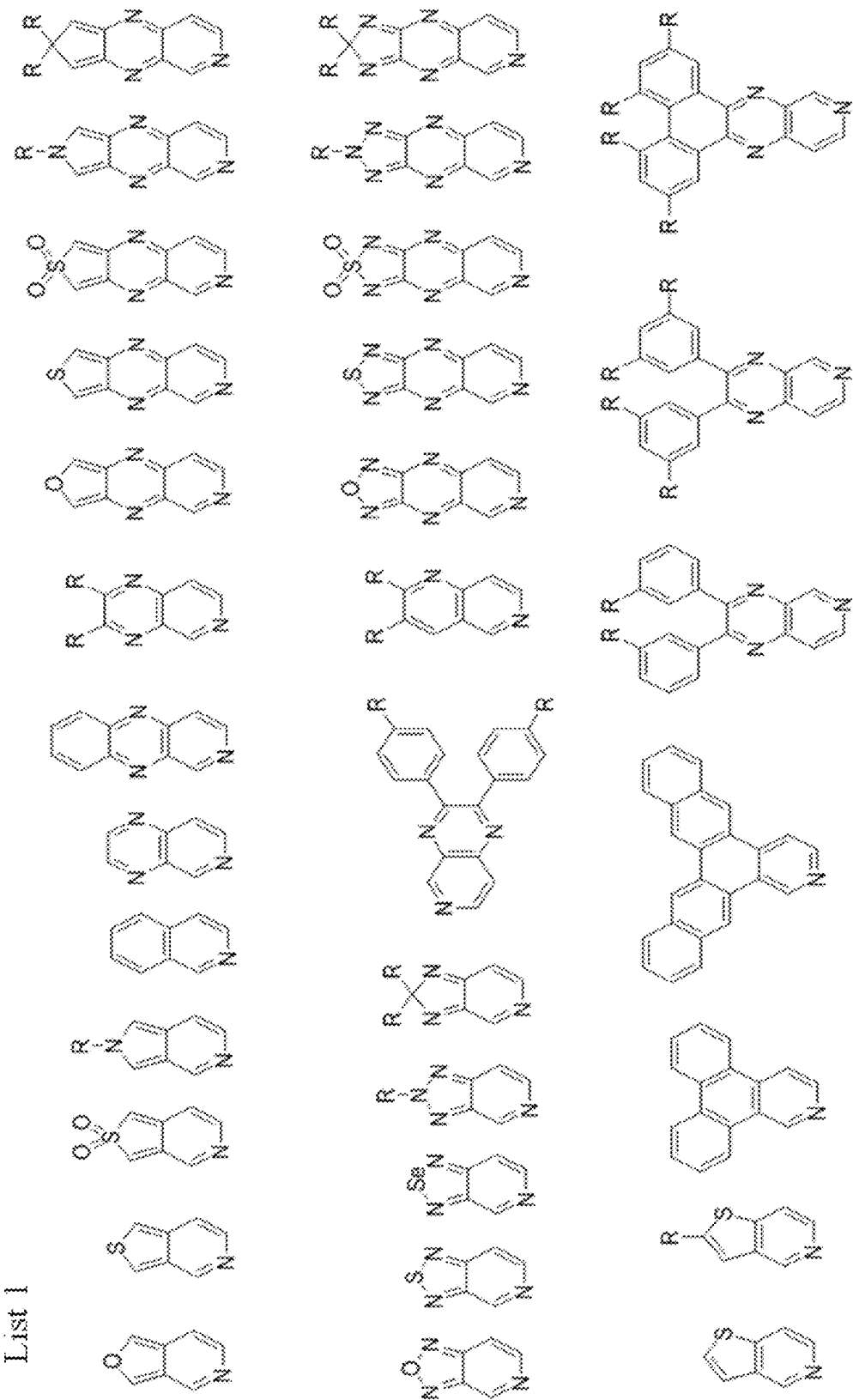
FIG. 10A provides an illustrative non-limiting list of enantiopure or enantioenriched pyridine units useful in embodiments of the invention.
Figure 10B:
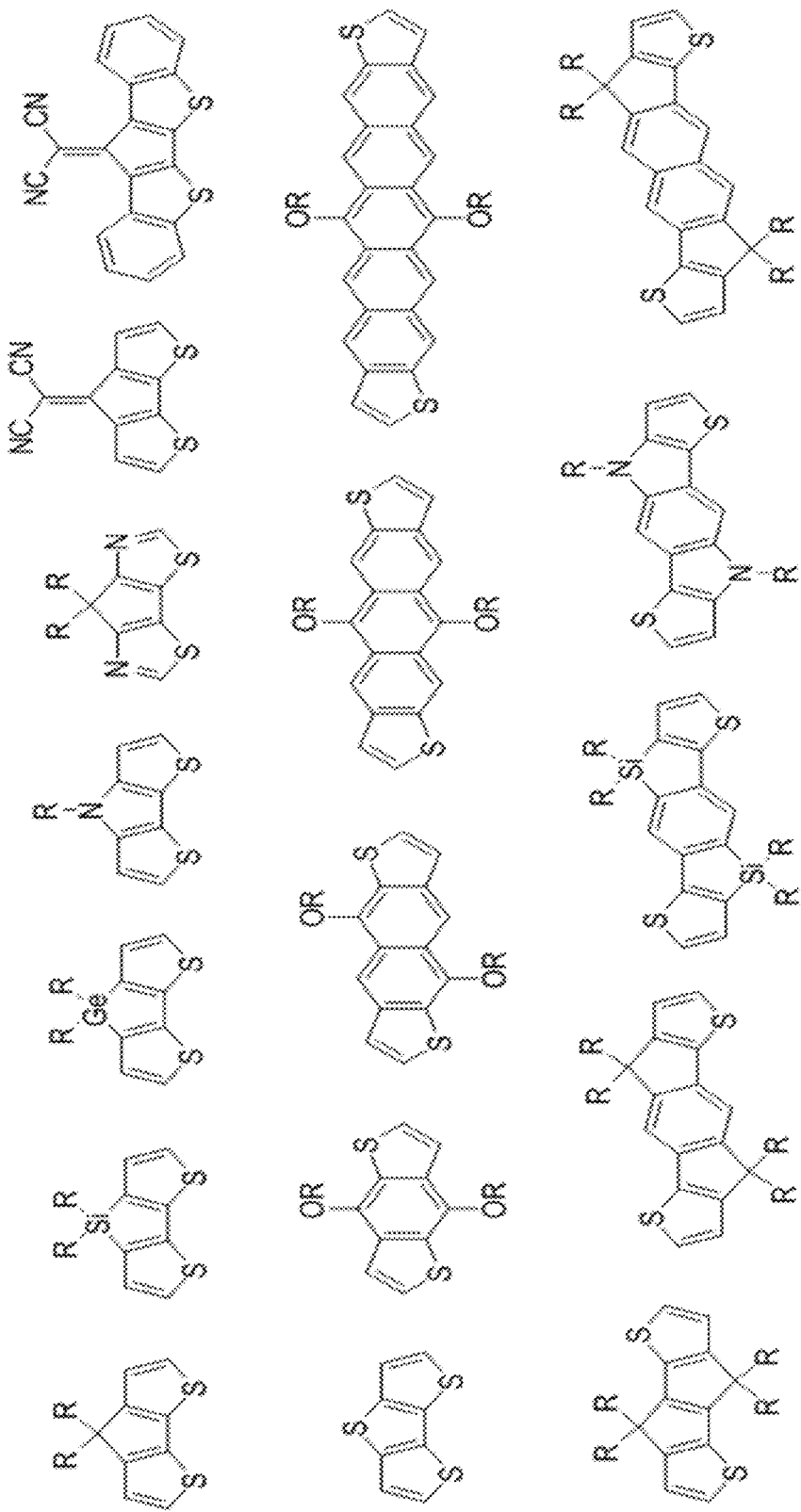
FIG. 10B provides an illustrative non-limiting list of enantiopure or enantioenriched dithiophene units useful in embodiments of the invention.

In some aspects of the invention, a regioregular polymer that includes a regioregular conjugated main chain section having a repeat unit is provided. The repeat unit can include a pyridine unit as shown in FIG. 10A, or a dithiophene unit as shown in FIG. 10B, or a combination thereof. In particular embodiments, the pyridine unit is of the following formula:

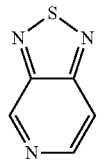

and the dithiophene unit is of the following formula:

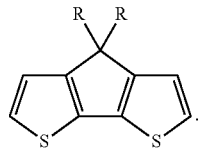

In another aspect, a regioregular polymer comprising a regioregular conjugated main chain having a repeat unit of the following formula is provided:

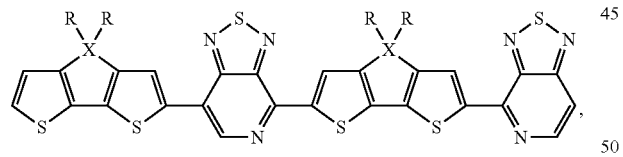

where each R is independently nothing or an enantiopure or enantioenriched substituted or non-substituted chiral alkyl or alkoxy chain, and X is C, Si, Ge, N or P. In some embodiments, the repeat unit has the following formula:

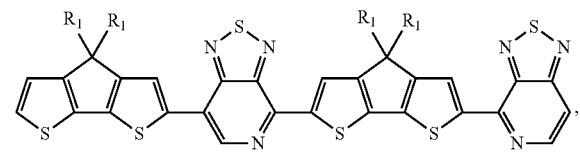

where each $R_1$ is independently nothing or an enantiopure or enantioenriched substituted or non-substituted chiral alkyl or alkoxy chain.

In any regioregular polymer or embodiment of any regioregular polymer, the enantiopure or enantioenriched substituted or non-substituted chiral alkyl or alkoxy chain can be a $C_6$-$C_{30}$ enantiopure or enantioenriched substituted or non-substituted chiral alkyl or alkoxy chain, or can be enantiopure or enantioenriched (S)-2-methylbutyl, (S)-2-ethylhexyl, (S)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl. Also, in any regioregular polymer or embodiment of any regioregular polymer, the charge carrier mobility of the polymer can be greater than the charge carrier mobility of a polymer of similar regioregularity and composition but having a racemic substituted or non-substituted chiral alkyl or alkoxy chain.

Another embodiment of the invention is a method of forming a regioregular conjugated polymers of the type that is useful, for example in organic semiconductor films. Typically, these methods comprise the steps of forming a regioregular conjugated polymer by selecting monomers comprising an enantiopure or enantioenriched chiral side groups; and then performing a polymerization reaction on the monomers so as to produce a polymer that comprises a regioregular conjugated main chain section having enantiopure or enantioenriched chiral side chains. Typically the monomers are also selected for an ability to form a donor-acceptor conjugated polymer comprising a plurality of donor repeating units and a plurality of acceptor repeating units.

In some embodiments of the invention, the method also comprises regioselectively preparing the monomers prior to the polymerization reaction. Optionally, for example, regioselectively preparing the monomers comprises reacting halogen-functionalized thiadiazolo[3,4-c]pyridine with organotin-functionalized cyclopenta[2,1-b:3,4-b']dithiophene comprising an enantiopure or enantioenriched chiral side group. In specific illustrative embodiments of the invention, the organotin-functionalized cyclopenta[2,1-b:3,4-b']dithiophene has the following formula:

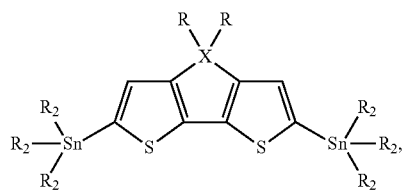

wherein each R is independently nothing or an enantiopure or enantioenriched substituted or non-substituted chiral alkyl or alkoxy chain, each $R_2$ is independently methyl or n-butyl, and X is C, Si, Ge, N or P.

As disclosed herein, a variety of reagents can be used to form embodiments of the invention. In some methodological embodiments of the invention, the monomer comprises the formula:

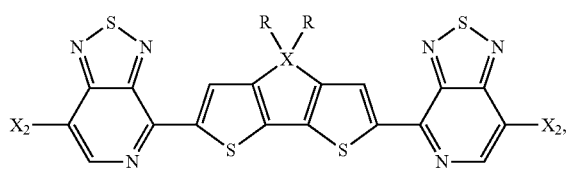

wherein each R is independently nothing or an enantiopure or enantioenriched substituted or non-substituted chiral alkyl or alkoxy chain, X is C, Si, Ge, N or P, and each $X_2$ independently comprises a halogen. Optionally, for example, the monomer has the following formula:

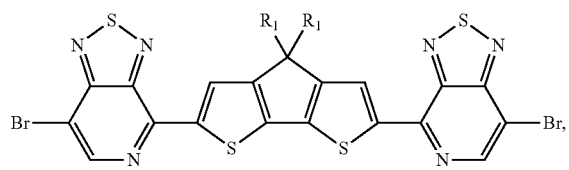

wherein each $R_1$ is independently nothing or an enantiopure or enantioenriched substituted or non-substituted chiral alkyl or alkoxy chain.

In another aspect of the invention, a method of preparing a regioregular polymer, including a donor-acceptor conjugated regioregular polymer, is provided. The method includes regioselectively preparing a monomer that includes an enantiopure or enantioenriched chiral side group; and reacting the monomer to produce a polymer that includes a regioregular conjugated main chain section having an enantiopure or enantioenriched chiral side chain. Preparing the monomer can include reacting a halogen-functionalized thiadiazolo[3,4-c]pyridine with an organotin-functionalized cyclopenta[2,1-b:3,4-b']dithiophene having an enantiopure or enantioenriched chiral side group. In some embodiments, the organotin-functionalized cyclopenta[2,1-b:3,4-b']dithiophene can have the following formula:

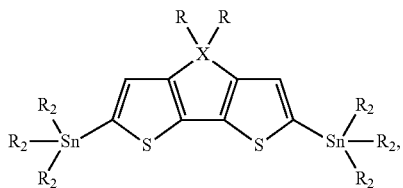

where each R is independently nothing or an enantiopure or enantioenriched substituted or non-substituted chiral alkyl or alkoxy chain, each $R_2$ is independently methyl or n-butyl, and X is C, Si, Ge, N or P.

In some embodiments, the monomer can have the following formula:

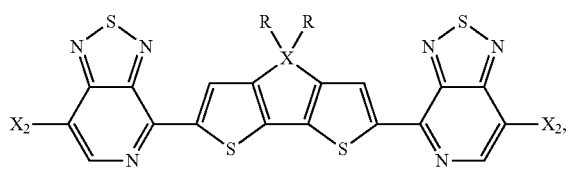

where each R is independently nothing or an enantiopure or enantioenriched substituted or non-substituted chiral alkyl or alkoxy chain, X is C, Si, Ge, N or P, and $X_2$ comprises a halogen. In particular embodiments, the monomer can have the following formula:

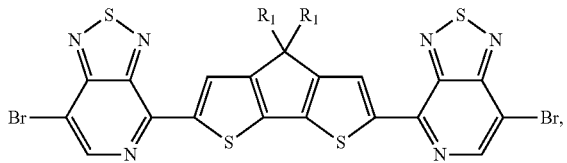

wherein each $R_1$ is independently nothing or an enantiopure or enantioenriched substituted or non-substituted chiral alkyl or alkoxy chain.

In the method, reacting the monomer to produce a polymer can include reacting the monomer with a cyclopenta[2,1-b:3,4-b']dithiophene monomer.

In any embodiment of the method, the enantiopure or enantioenriched substituted or non-substituted chiral alkyl or alkoxy chain can be a $C_6$-$C_{30}$ enantiopure or enantioenriched substituted or non-substituted chiral alkyl or alkoxy chain, or can be enantiopure or enantioenriched (S)-2-methylbutyl, (S)-2-ethylhexyl, (S)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl.

Embodiments of the polymer may be incorporated in electronic devices. Examples of electronic devices include, but are not limited to, field effect transistors, organic photovoltaic devices, polymer light emitting diodes, organic light emitting diodes, organic photodetectors and biosensors.

The performance of any organic device depends on the mobility of the charge carriers. For example, if the charge applied to an OLED remains stuck next to the electrodes for a long time, this will not lead an internal current that is transformed into the emission of photons. Similarly, after absorbing energy and attaining the excited state an organic photovoltaic must separate the charge and transport it to the electrodes. Charge carrier mobility in transistors determines how fast the device can be turned on and off. In this context, the charge carrier mobility of the regioregular polymer with an enantiopure or enantioenriched side chain can be greater than the charge carrier mobility of a similar regioregular polymer with a racemic side chain of similar composition (e.g. a control regioregular polymer formed without using enantiopure or enantioenriched reactants that is under similar testing conditions etc.). In some enantiopure or enantioenriched embodiments, the charge carrier mobility is 10, 20, 30, 40 or 50% greater than a corresponding racemic polymer. In other enantiopure or enantioenriched embodiments, the charge carrier mobility is 2, 3, or more than 3 times greater than a corresponding racemic polymer.

Embodiments of the regioregular polymer with enantiopure or enantioenriched side chains disclosed herein can be used to modulate the threshold voltage of devices in which they are used (i.e. the voltage that allows the flow of electrons through a gate-source junction). For example, these polymers can be used to form an active semiconducting layer in a device so that the threshold voltage of the device is less than the threshold voltage of an analogous device that uses an active semiconducting layer formed from a corresponding "control" regioregular polymer having racemic side chains.

Organic semiconductor films that are useful in a variety of devices can be formed using the methods and materials of the invention. Such devices include solar cells, photovoltaic cells, photodetectors, photodiodes, phototransistors, and thin film transistors. One embodiment of the invention is a device comprising a composition of matter that includes regioregular conjugated polymer having a main chain comprising a repeat unit including a dithiophene of the formula:

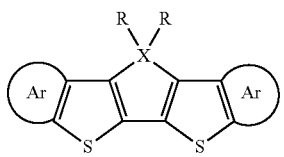

and a pyridine of the formula:

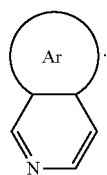

In such embodiments, each Ar is independently nothing or a substituted or non-substituted aromatic functional group, each R is independently nothing or an enantiopure or enantioenriched substituted or non-substituted chiral alkyl or chiral alkoxy chain, and X is C, Si, Ge, N or P. In addition, in these embodiments of the invention, the polymer typically forms a donor-acceptor conjugated polymer including a plurality of donor repeating units and a plurality of acceptor repeating units. Typically in these devices, this composition forms an active semiconducting layer.

Embodiments of the invention include devices designed to include the regioregular conjugated polymers selected to exhibit certain optical or electrical properties. Optionally, for example, the device uses regioregular conjugated polymers of the invention selected for their ability to modulate charge carrier mobility. In solid-state physics, the electron mobility characterizes how quickly an electron can move through a material, when pulled by an electric field. In semiconductors, there is an analogous quantity for holes, called hole mobility. The term carrier mobility refers in general to both electron and hole mobility in semiconductors.

In certain embodiments of the invention, regioregular conjugated polymers formed with chiral selected monomers exhibit a specific property such as a greater charge carrier mobility than the charge carrier mobility of comparable polymers formed without using enantioenriched or enanantiopure monomers. Data found in Example 1 below show that a regioregular conjugated polymer formed with chiral selected monomers (P2S) has a higher hole mobility than a control regioregular conjugated polymer (P2) formed from monomers wherein R is not an enantiopure or enantioenriched. In addition, this P2S regioregular conjugated polymers formed with chiral selected monomers exhibited a lower threshold voltage (16 V), a compared to this P2 control (25V).

In some embodiments of the invention, the polymer is designed to exhibit an electron hole mobility that is at least 10%, 25%, 50%, 75%, 100%, 200%, 300% or 400% greater than the electron hole mobility of a control regioregular conjugated polymer, one that is formed from monomers wherein R is not an enantiopure or enantioenriched substituted or non-substituted chiral alkyl or chiral alkoxy chain. In certain embodiments of the invention, the device exhibits a threshold voltage that is at least 10%, 20%, 25%, 30% or 35 less than that exhibited by a device formed with a control regioregular conjugated polymer, one that is formed from monomers wherein R is not an enantiopure or enantioenriched substituted or non-substituted chiral alkyl or chiral alkoxy chain. Typically in such embodiments, the device is a field effect transistor, organic photovoltaic device, polymer light emitting diode, organic light emitting diode, organic photodetector, or biosensor.

Figure 12:
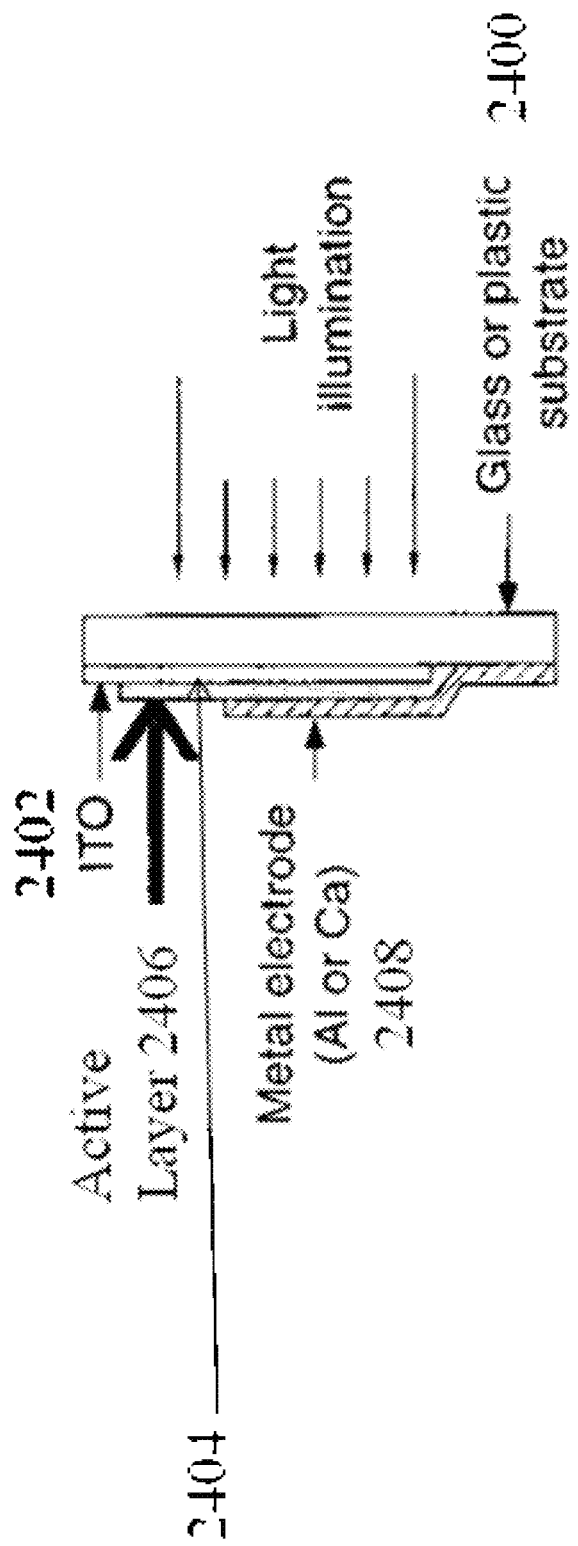
FIG. 12 is a cross sectional schematic of a solar cell having an active region including the polymer or small molecule, according to one or more embodiments of the invention.
Figure 13:
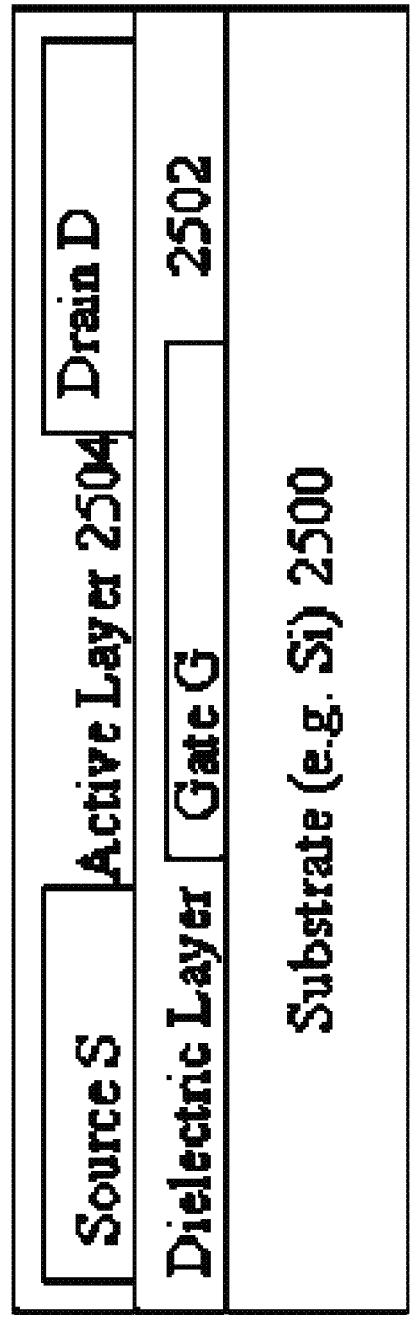
FIG. 13 is a cross sectional schematic of a transistor or electronic device having an active region including the polymer or small molecule, according to one or more embodiments of the invention.
Figure 14:
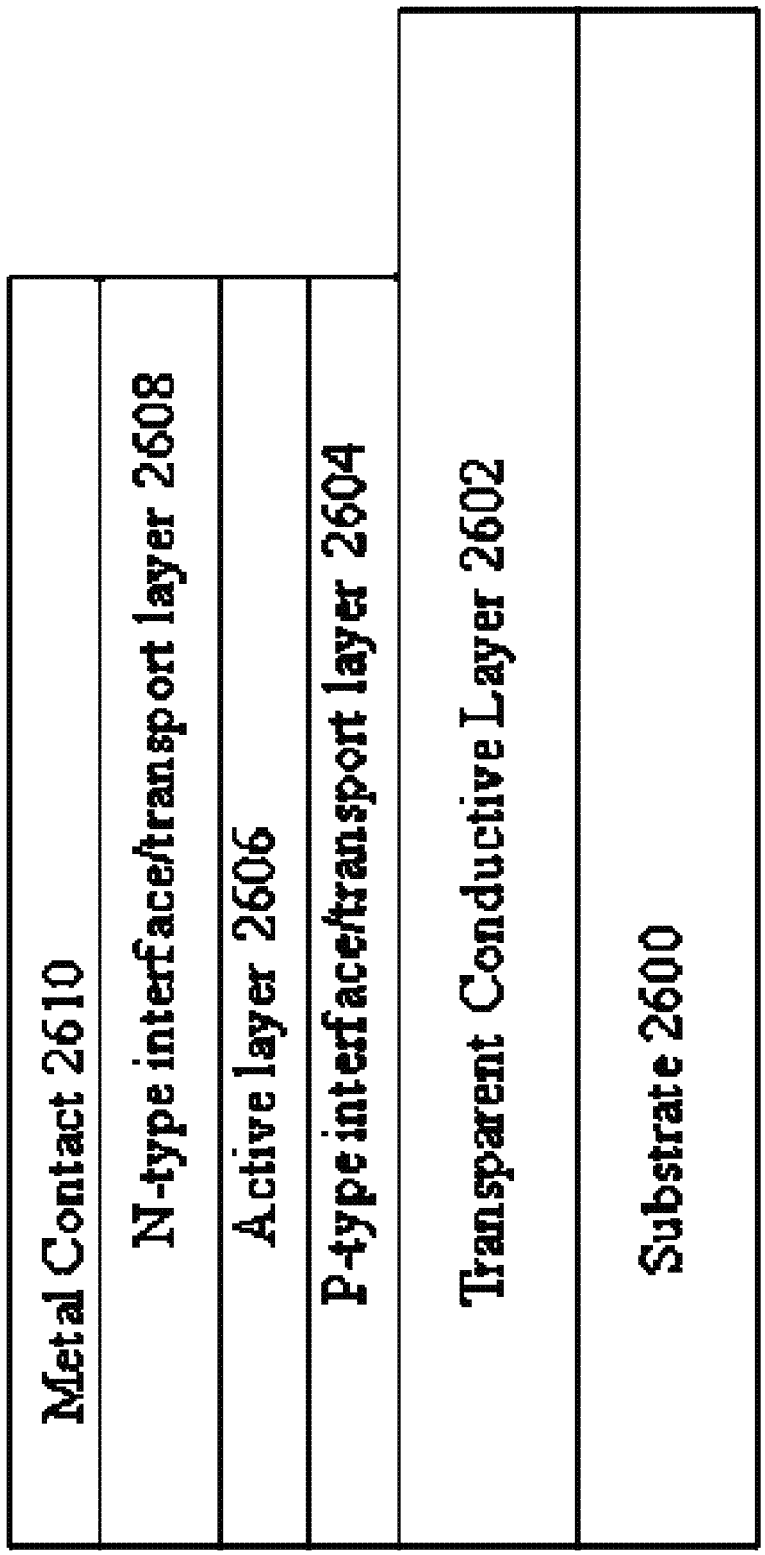
FIG. 14 is a cross sectional schematic of a light emitting diode having an active region including the polymer or small molecule, according to one or more embodiments of the invention.

FIGS. 12-14 show illustrative device configurations that can use polymers of the invention. FIG. 12 illustrates a solar cell device structure according to one or more embodiments, comprising a substrate 2400, a transparent conductive layer 2402 on, above, or overlying the substrate, a p-type interface layer 2404 on, above, or overlying the transparent conductive layer 2402, an active layer 2406 (e.g. one comprising a polymer disclosed herein) on, above, or overlying the p-type interface layer, and a metal contact 2408 on, above, or overlying the active layer 2406. FIG. 13 illustrates an organic transistor structure, according to one or more embodiments, comprising a substrate 2500, a gate G on or above the substrate, a dielectric layer 2502 on the Gate G, an active layer 2504 on or above the dielectric layer 2502, and source S and drain D contacts contacting the active layer 2504.

FIG. 14 illustrates an optoelectronic device, an organic light emitting diode (OLED), comprising an active layer including a conjugated polymer according to one or more embodiments of the present invention. The OLED comprises a substrate 2600, a transparent conductive layer 2602 (e.g., ITO) on, above, or overlying the substrate 2600 (e.g., glass, plastic), a p-type hole transport layer 2604 on, above, or overlying the transparent conductive layer 2602, the active or emission layer 2606 on, above, or overlying the p-type hole transport layer 2604, an n-type electron transport layer 2608 on, above, or overlying the active layer 2606, and a metal contact 2610 to the n-type transport layer 2608. The active layer 2606 can comprise a donor-acceptor type regioregular polymer disclosed herein.

Some embodiments of the invention comprise a regioregular polymer including a regioregular conjugated main chain section. The regioregular conjugated main chain section includes a repeat unit having a dithiophene of the formula:

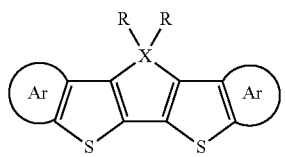

and a pyridine of the formula:

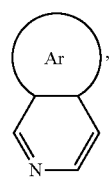

where each Ar is independently nothing or a substituted or non-substituted aromatic functional group, each R is independently nothing or an enantiopure or enantioenriched substituted or non-substituted chiral alkyl or alkoxy chain, and X is C, Si, Ge, N or P. In the main chain section, the substituted or non-substituted aromatic functional group can include one or more alkyl chains, which can each independently be a $C_6$-$C_{30}$ substituted or non-substituted alkyl chain, —(CH$_2$CH$_2$O)n (n=2-20), $C_6H_5$, —$C_nF_{(2n+1)}$ (n=2-20), —(CH$_2$)$_n$N(CH$_3$)$_3$Br (n=2-20), or —(CH$_2$)$_n$N(C$_2$H$_5$)$_2$ (n=2-20). In a further aspect, a device that includes any regioregular polymer or embodiment of any regioregular polymer is provided. The device can be a field effect transistor, an organic photovoltaic device, a polymer light emitting diode, an organic light emitting diode, an organic photodetector, or a biosensor. In any embodiment of the device, the regioregular polymer can form an active semiconducting layer. When the polymer forms an active semiconducting layer, the threshold voltage of the device can be less than the threshold voltage of a similar device containing a polymer of similar regioregularity and composition but having a racemic substituted or non-substituted chiral alkyl or alkoxy chain.

In particular embodiments, the enantiopure or enantioenriched substituted or non-substituted chiral alkyl or alkoxy chain can be a $C_6$-$C_{30}$ enantiopure or enantioenriched substituted or non-substituted chiral alkyl or alkoxy chain, or can be enantiopure or enantioenriched (S)-2-methylbutyl, (S)-2-ethylhexyl, (5)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl.

The regioselectively prepared monomer with enantiopure or enantioenriched side group can have the following formula:

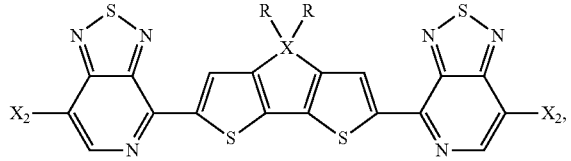

where each R is independently nothing or an enantiopure or enantioenriched substituted or non-substituted chiral alkyl or alkoxy chain, X is C, Si, Ge, N or P, and each $X_2$ independently comprises a halogen. In particular embodiments, $X_2$ can be I, Br, Cl, or $CF_3SO_3$. In some embodiments, the R groups are the same. In some embodiments, the monomer has the following formula:

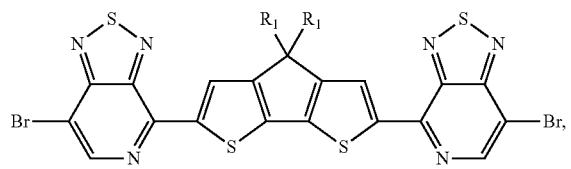

where each $R_1$ is independently nothing or an enantiopure or enantioenriched substituted or non-substituted chiral alkyl or alkoxy chain. In some embodiments, the enantiopure or enantioenriched substituted or non-substituted chiral alkyl or alkoxy chain can be a $C_6$-$C_{30}$ enantiopure or enantioenriched substituted or non-substituted chiral alkyl or alkoxy chain, or can be enantiopure or enantioenriched (S)-2-methylbutyl, (S)-2-ethylhexyl, (S)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl. In some embodiments, the $R_1$ groups are the same.

In the method of preparing a regioregular polymer having an enantiopure or enantioenriched chiral side chain, a monomer with an enantiopure or enantioenriched chiral side group is regioselectively prepared. In some embodiments, the monomer is prepared by reacting halogen-functionalized thiadiazolo[3,4-c]pyridine with organotin-functionalized cyclopenta[2,1-b:3,4-b']dithiophene. The reaction can be carried out at a temperature in the range of about 50° C. to about 150° C., and the regioselectivity of the reaction can be 95% or greater.

The halogen-functionalized thiadiazolo[3,4-c]-pyridine compound can have the following formula (I):

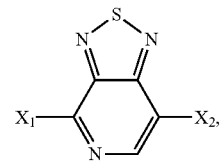

where $X_1$ and $X_2$ independently comprise a halogen, which in particular embodiments can be I, Br, Cl, or $CF_3SO_3$.

The organotin-functionalized cyclopenta[2,1-b:3,4-b'] dithiophene compound can have the following formula:

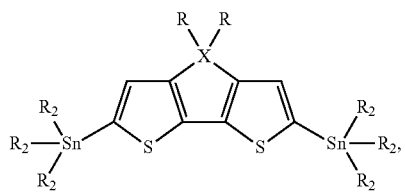

where each R is independently nothing or an enantiopure or enantioenriched chiral alkyl chain or an enantiopure or enantioenriched chiral alkoxy chain, each $R_2$ is independently methyl or n-butyl, and X is C, Si, Ge, N or P. The chiral alkyl or alkoxy chain can be substituted or non-substituted. In some embodiments, the R groups are the same.

In the method, the monomer with enantiopure or enantioenriched side group is regioselectively prepared, then the monomer is reacted or polymerized to form a regioregular polymer having a regioregular conjugated main chain section with an enantiopure or enantioenriched side chain. To form the regioregular polymer, the monomer with enantiopure or enantioenriched side group can be reacted to a monomer containing an enantiopure or enantioenriched cyclopenta[2,1-b:3,4-b']dithiophene unit. The polymerization reaction can take place at a temperature in the range of about 80° C. to about 200° C. The regioregular conjugated main chain section can comprise 5-30, or more, contiguous repeat units. In some embodiments, the number of repeat units is in the range of 10-20 repeats. The regioregularity of the conjugated main chain section can be 95% or greater.

The regioregular polymer in some embodiments has a main chain section that includes a repeat unit containing a dithiophene of the formula:

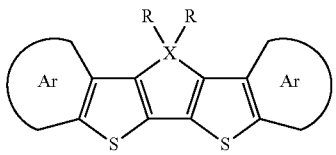

and a pyridine of the formula:

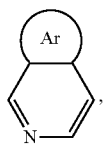

where each Ar is independently nothing or a substituted or non-substituted aromatic functional group, each R is independently nothing or an enantiopure or enantioenriched substituted or non-substituted chiral alkyl or alkoxy chain, and X is C, Si, Ge, N or P. The substituted or non-substituted aromatic functional group can include one or more alkyl chains, each of which independently can be a $C_6$-$C_{30}$ substituted or non-substituted alkyl chain, —$(CH_2CH_2O)n$ (n=2-20), $C_6H_5$, —$C_nF_{(2n+1)}$ (n=2-20), —$(CH_2)_nN(CH_3)_3Br$ (n=2-20), or —$(CH_2)_nN(C_2H_5)_2$ (n=2-20). The enantiopure or enantioenriched substituted or non-substituted chiral alkyl or alkoxy chiral chain can be a $C_6$-$C_{30}$ enantiopure or enantioenriched substituted or non-substituted chiral alkyl or alkoxy chain, or can be enantiopure or enantioenriched (S)-2-methylbutyl, (S)-2-ethylhexyl, (S)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl. In some embodiments, the R groups are the same.

In embodiments of the regioregular polymer, the repeat unit of the regioregular conjugated main chain section can contain a pyridine unit as shown in FIG. 10A. In FIG. 10A, each R is independently a substituted or non-substituted alkyl chain, which can be a $C_6$-$C_{30}$ substituted or non-substituted alkyl chain. In some embodiments, the R groups of a pyridine unit are the same.

In embodiments of the regioregular polymer, the repeat unit of the regioregular conjugated main chain section can contain an enantiopure or enantioenriched dithiophene unit as shown in FIG. 10B. In FIG. 10B, each R is independently an enantiopure or enantioenriched substituted or non-substituted chiral alkyl or alkoxy chain, which can be a $C_6$-$C_{30}$ enantiopure or enantioenriched substituted or non-substituted chiral alkyl or alkoxy chain, or can be enantiopure or enantioenriched (S)-2-methylbutyl, (S)-2-ethylhexyl, (5)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl. In some embodiments, the R groups of a dithiophene unit are the same. A repeat unit may contain any combination of a pyridine unit shown in FIG. 10A and dithiophene unit shown in FIG. 10B.

In some embodiments, the regioregular polymer comprises a regioregular conjugated main chain having a repeat unit of the following structure:

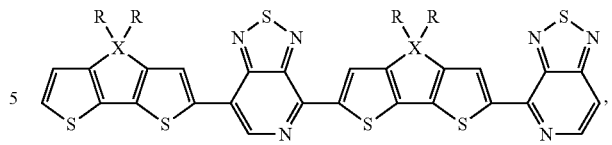

where each R is independently nothing or an enantiopure or enantioenriched substituted or non-substituted chiral alkyl or alkoxy chain, and X is C, Si, Ge, N or P. In some embodiments, the R groups are the same. In particular embodiments, the repeat unit has the following structure:

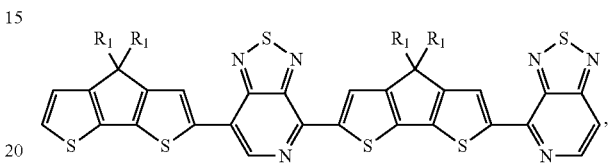

where each $R_1$ is independently nothing or an enantiopure or enantioenriched substituted or non-substituted chiral alkyl or alkoxy chain. In some embodiments, each R or $R_1$ can be a $C_6$-$C_{30}$ enantiopure or enantioenriched substituted or non-substituted chiral alkyl or alkoxy chain, or can be enantiopure or enantioenriched (S)-2-methylbutyl, (S)-2-ethylhexyl, (S)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl. In some embodiments, the $R_1$ groups are the same. In some embodiments, the polymer is prepared by any of the methods described herein, or shown in Scheme 1 of FIG. 11A.

The present invention may be better understood by referring to the accompanying examples, which are intended for illustration purposes only and should not in any sense be construed as limiting the scope of the invention.

EXAMPLES

The following Example(s) illustrate the versatility and scope of the embodiments of the instant invention.

Example 1

Illustrative Methods, Materials and Devices of the Invention

Illustrative Experimental Protocols (S)-2-Ethylhexan-1-ol (M1)

To 1000 ml of phosphate buffer (0.1 M, $HK_2PO_4/H_2KPO_4$ with 95/5 in mol/mol, pH~8.0) was added yeast (200 g, Sigma Aldrich) and sucrose (10 g, Thermo FiSEHr Scientific Inc.), and the mixture was stirred for 2 hrs. Then pentane (1500 ml) was added followed by adding 2-ethylidenehexanal (10.0 g, 79.2 mmol, TCI). The mixture was stirred for 2 days. Then the mixture was divided into batches of 300 ml each, and separated by centrifuging, and the yeast and water phase was extracted with pentane. After volatiles were removed, 12.0 g of yellowish oil was collected, with the crude product yield over 100%. GC and GC/MS analysis indicated an impurity of about 40% (~4.8 g) while starting materials were less than 2%. The impurity was judged to be 2-ethylidenehexan-1-ol based on GC/MS results (with m/z of 128). The crude product was dissolved in dichloromethane and cooled down to 0° C., meta-chloroperoxybenzoic acid (MCPBA) (6.46 g, 37.5 mmol) was added, and the reaction was stirred at 0° C. for 1 hr. Then the reaction was poured into deionized water, the organic phase was extracted with dichlormethane, and then the organic phase was dried over sodium sulfate. The volatiles of the organic phase were removed under reduced pressure, and the resulted dark oil was separated by flash column chromatography with pentane/dichloromethane (1/1 in v/v). The overall yield was 50%. $^1$H NMR (500 MHz, CDCl$_3$) δ (ppm): 3.58 (d, J=5.05 Hz, 2H), 1.44-1.24 (m, 10H), 0.92 (t, J=7.15 Hz, 6H). GC/MS: calcd for $C_8H_{18}O$ (m/z): 130.14. found 130. $[α]_D$=+3.1° (Concentration of 1.2 g/100 ml in acetone, 25° C.). ([Ref]: $[α]_D$=+ 3.1°, e.e. =96%, C. R. G. Grenier, S. J. George, T. J. Joncheray, E. W. Meijer, and J. R. Reynolds, *J. Am. Chem. Soc.* 2007, 129, 10694-10699.

(S)-2-Ethylhexylbromide (M2)

To a solution of triphenylphosphine (9.0 g, 34.3 mmol) in freshly distilled dichloromethane (70 ml) at 0° C. was added Br$_2$ (11.0 g, 68.6 mmol) dropwise. Then the solution of M1 (3.28 g, 25.2 mmol) in pyridine (5 ml) was added dropwise at 0° C. The mixture was stirred at 0° C. for 1 hr, then at 25° C. for another 1 hr. The reaction was quenched by adding sodium bisulfite (10% in water). Then the solution was precipitated in ethyl ether/hexane (1000 ml, 1/1 in v/v) and filtrated. The organic phase was collected and concentrated under reduced pressure. Column separation with hexane as eluent gave 4.38 g of the product as a colorless liquid, with a yield of 90%. $^1$H NMR (500 MHz, CDCl$_3$) δ (ppm): 3.45 (m, 2H), 1.56 (m, 1H), 1.46-1.25 (m, 8H), 0.92 (t, J=7.15 Hz, 6H). $^{13}$C NMR (125 MHz, CDCl$_3$) δ (ppm): 41.07, 39.08, 31.89, 28.83, 25.18, 22.83, 14.03, 10.86. GC/MS: calcd for $C_8H_{17}Br$ (m/z): 192.05. found 192. e.e. =90% (reverse phase chiral GC).

4,4-Bis((S)-2-ethylhexyl)-4H-cyclopenta[1,2-b:5,4-b']dithiophene (M3)

To a solution of 4H-cyclopenta[1,2-b:5,4-b']dithiophene (CDT) (0.53 g, 3 mmol) in degassed dimethyl sulfoxide (10 ml) was added M2 (1.20 g, 6.2 mmol) and a catalyst amount of potassium iodide (30 mg). The mixture was stirred under Ar followed by adding potassium hydroxide powder. Then the mixture was stirred under argon for 12 hrs at 60° C. After stirring, the mixture was poured into deionized water (100 ml) and the organic phase was extracted with hexane (3×100 ml), and then the organic phase was washed with deionized water (3×100 ml), and dried over sodium sulfate. After volatiles were removed under reduced pressure, the resulting dark-red oil was separated by flash column chromatography to give 0.96 g of colorless oil, with a yield of 80%. $^1$H NMR (500 MHz, CDCl$_3$) δ (ppm): 7.15 (d, J=4.90 Hz, 2H), 6.96 (d, J=4.90 Hz, 2H), 1.93 (m, 4H), 1.09-0.86 (m, 18H), 0.80 (t, J=6.90 Hz, 6H), 0.66 (t, J=7.10 Hz, 6H). $^{13}$C NMR (125 MHz, CDCl$_3$) δ (ppm): 157.61, 136.84, 123.97, 122.32, 53.26, 43.32, 35.07, 34.16, 28.62, 27.30, 22.80, 14.09, 10.70. GC/MS: calcd for $C_{25}H_{38}S_2$ (m/z): 402.25. found 402. $[α]_D$=-60.1° (Concentration of 2.78 g/100 ml in acetone, 25° C.).

(4,4-Bis((S)-2-ethylhexyl)-4H-cyclopenta[1,2-b:5,4-b']dithiophene-2,6-diyl)bis(trimethylstannane) (M4)

A dry three-neck round bottom flask was equipped with a Schlenk adapter, dropping funnel, and rubber septum. Under nitrogen, M3 (0.40 g, 1 mmol) was dissolved in dry THF (12 ml) and cooled to -78° C. using a dry ice/acetone cold bath. Under nitrogen, a solution of t-butyllithium (1.7 M in pentane, 2.35 ml, 4 mmol) was added dropwise over 15 minutes to the reaction vessel. The reaction was stirred at -78° C. under nitrogen for one hour and stirred at room temperature for 3 hours. Under nitrogen, a solution of trimethyltin chloride (1.0 g, 5 mmol) in dry pentane (3 ml) was added dropwise over 5 minutes to the reaction vessel at -78° C. The reaction was stirred at -78° C. under nitrogen for 1 hour and subsequently warmed to room temperature and stirred overnight. The mixture was then poured into deionized water (3×100 ml) and the organic phase extracted with hexanes (3×50 ml). The organic phases were collected and washed with deionized water (3×50 ml), dried over sodium sulphate, filtered, and concentrated. The product was dried under high vacuum with agitation for 48 hours to give 0.70 g of white solid, with a yield of 96%. $^1$H NMR (500 MHz, CD$_2$Cl$_2$) δ (ppm): 7.04 (s, 2H), 1.93 (m, 4H), 1.04-0.88 (m, 18H), 0.79 (t, J=6.90 Hz, 6H), 0.64 (t, J=7.15 Hz, 6H), 0.40 (s, 18H). $^{13}$C NMR (125 MHz, CD$_2$Cl$_2$) δ (ppm): 159.87, 142.54, 136.48, 130.42, 52.18, 43.09, 35.21, 34.38, 28.69, 27.56, 22.83, 13.94, 10.55, -8.58.

4,4'-(4,4-Bis((S)-2-ethylhexyl)-4H-cyclopenta[1,2-b:5,4-b']dithiophene-2,6-diyl)bis(7-bromo-[1,2,5]thiadiazolo[3,4-c]pyridine) (M5)

To a 10-20 ml microwave tube was added M4 (0.364 g, 0.5 mmol), 4,7-dibromo-[1,2,5]thiadiazolo[3,4-c]pyridine (0.295 g, 1 mmol), Pd(PPh$_3$)$_4$ (57.8 mg, 0.05 mmol) and freshly distilled toluene (10 ml) under the protection of nitrogen, then the microwave tube was sealed. Microwave assisted Stille coupling was performed by the following procedure: 120° C. for 10 min, 140° C. for 10 min, 160° C. for 10 min and 170° C. for 40 min. The reaction was cooled to room temperature, extracted with chloroform (100 ml×3), and then the organic phase was washed with deionized water (100 ml×3) and dried over with anhydrous magnesium sulfate. After removing solvent under reduced pressure, the mixture was separated by silica column with hexane/chloroform (form 100/0 to 0/100 in v/v) to give 0.36 g of dark-red oil, with a yield of 86%. $^1$H NMR (500 MHz, CD$_2$Cl$_2$) δ (ppm): 8.66 (s, 2H), 8.65 (s, 2H), 2.12 (m, 4H), 1.09-0.95 (m, 16H), 0.85 (m, 2H), 0.67-0.63 (m, 12H). $^{13}$C NMR (125 MHz, CD$_2$Cl$_2$) δ (ppm): 161.76, 156.38, 147.88, 147.68, 146.00, 146.00, 143.20, 127.74, 107.44, 54.49, 43.13, 35.47, 34.29, 28.56, 27.59, 22.83, 14.06, 10.77.

4,4-Bis(2-ethylhexyl)-4H-cyclopenta[1,2-b:5,4-b']dithiophene (M6)

The synthesis procedure was the same as that of M3, except that 2-ethylhexylbromide was used as starting material instead of (S)-3-(bromomethyl)heptane (M2). A colorless oil was obtained, with a yield of 85%. $^1$H NMR (500 MHz, CDCl$_3$) δ (ppm): 7.15 (d, J=4.60 Hz, 2H), 6.97 (d, J=4.60 Hz, 2H), 1.96 (m, 4H), 1.07-0.88 (m, 18H), 0.82 (m, 6H), 0.68 (m, 6H). $^{13}$C NMR (125 MHz, CDCl$_3$) δ (ppm): 156.66, 135.89, 123.01, 121.33, 52.29, 42.34, 34.07, 33.21, 27.66, 26.34, 21.81, 13.14, 9.70. GC/MS: calcd for $C_{25}H_{38}S_2$ (m/z): 402.25. found 402.

(4,4-Bis(2-ethylhexyl)-4H-cyclopenta[1,2-b:5,4-b']dithiophene-2,6-diyl)bis(trimethylstannane) (M7)

The synthesis procedure was the same as that of M4, except that M6 was used as starting material instead of M3. A colorless oil was obtained, with a yield of 95%. $^1$H NMR (500 MHz, CDCl$_3$) δ (ppm): 7.04 (s, 2H), 1.97-1.82 (m, 4H), 1.08-0.88 (m, 18H), 0.79 (m, 6H), 0.65 (m, 6H), 0.40 (s, 18H). $^{13}$C NMR (125 MHz, CDCl$_3$) δ (ppm): 159.86, 142.52, 136.48, 130.42, 52.17, 43.07, 35.20, 34.37, 28.68, 27.53, 22.81, 13.91, 10.52, −8.62.

4,4'-(4,4-Bis(2-ethylhexyl)-4H-cyclopenta[1,2-b:5,4-b']dithiophene-2,6-diyl)bis(7-bromo-[1,2,5]thiadiazolo[3,4-c]pyridine) (M8)

The synthesis procedure was the same as that of M5, except that M7 was used as starting material instead of M4. A dark brown solid was obtained, with a yield of 90%. $^1$H NMR (500 MHz, CDCl$_3$) δ (ppm): 8.66 (s, 4H), 2.15 (m, 4H), 1.10-0.89 (m, 16H), 0.80 (m, 2H), 0.66 (m, 12H). $^{13}$C NMR (125 MHz, CDCl$_3$) δ (ppm): 161.81, 156.41, 147.92, 147.73, 146.05, 146.02, 143.26, 127.72, 107.49, 54.53, 43.18, 35.51, 34.329, 28.60, 27.62, 22.86, 14.09, 10.79.

Illustrative Polymerization of Polymer Designated P2S

To a 2-5 ml microwave tube under nitrogen was added M4 (72.8 mg, 0.1 mmole), M5 (83.0 mg, 0.1 mmol), Pd(PPh$_3$)$_4$ (5.6 mg, 0.005 mmol) and freshly distilled xylenes (2 ml). The tube was sealed and subjected to the following reaction conditions in a microwave reactor: 80° C. for 2 min, 130° C. for 2 min, 170° C. for 2 min and 200° C. for 40 min. The reaction was allowed to cool to room temperature, then freshly distilled xylenes (2 ml) and tributyl(thiophen-2-yl)stannane (20 μl) were added and the reaction was subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 μl) was added and the reaction was subjected to the following reaction conditions in a microwave reactor: 80° C. for 2 min, 130° C. for 2 min, 170° C. for 2 min and 200° C. for 20 min. The product was precipitated in methanol, collected via centrifugation, re-dissolved in hot 1,2-dichlorobenzene, re-precipitated in methanol, and collected via centrifugation. The collected solid fibers were loaded into a cellulose extraction thimble and washed successively with methanol (12 hours), acetone (12 hours), hexanes (12 hours) and chloroform (12 hours). Solid residue in the thimble was collected and dried, re-dissolved in hot 1,2-dichlorobenzene, filtrated and re-precipitated in methanol. The resulting black fibers were collected via centrifugation, dried over a high vacuum line to give 87.0 mg of polymers, with a yield of 82%. $^1$H NMR (500 MHz, 1,2-dichlorobenzene-d$_4$, 110° C.) δ (ppm): 8.76 (m, 2H), 8.18 (s, 1H), 2.17 (m, 4H), 1.25-0.90 (m, 18H). 0.80-0.60 (m, 12H).

Figure 11A:
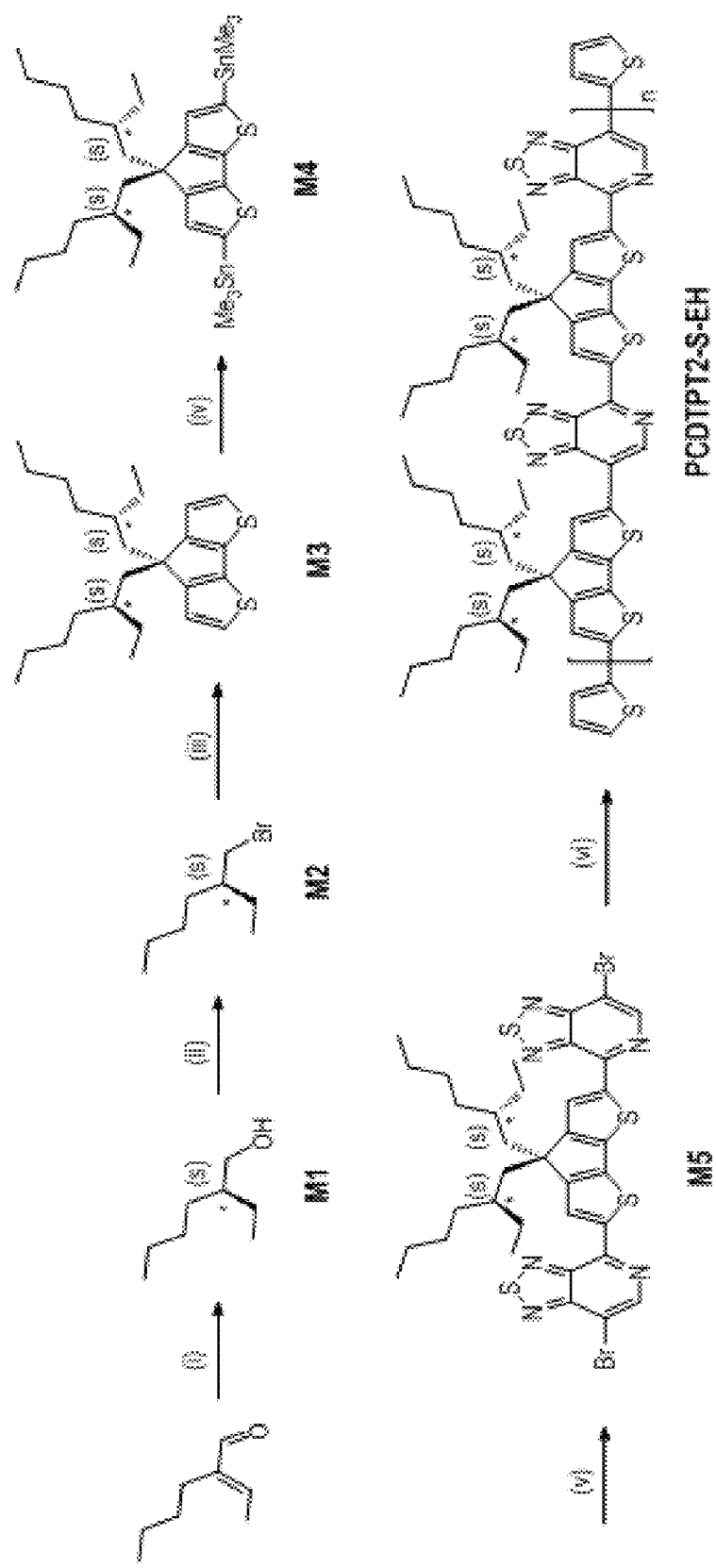
FIG. 11A provides a scheme for a synthetic route for making the polymer designated P2S.

FIG. 11A provides a schematic of a synthetic route for P2S. Steps shown in FIG. 11A include: (i) Yeast, 25° C. for 2 days, then treated with stoichiometry amount of MCPBA with respect to by-product of 2-ethylidenehexan-1-ol, 25° C. for 1 hr, overall yield of 50%; (ii) triphenylphosphine, Br$_2$, DCM, 90%; (iii) CDT, KOH/KI, DMSO, 60° C. for 8 hrs, 80%; (iv) t-BuLi, THF, −78° C. for 1 hr and 25° C. for 3 hrs, then Me$_3$SnCl at −78° C. for 1 hr and 25° C. for 8 hrs, 96%; (v) 4,7-dibromo-[1,2,5]thiadiazolo[3,4-c]pyridine, Pd(PPh$_3$)$_4$, toluene, microwave 175° C. for 40 mins, 92%; (vi) M4, Pd(PPh$_3$)$_4$, xylenes, MW 170° C. for 40 mins, 86%.

Illustrative Polymerization of Polymer Designated P2

The synthesis procedure was the same as that of P2-S-EH, except that M7 and M8 were used as starting materials instead of M4 and M5, respectively. The final polymer was obtained as a black powder, with a yield of 80%. $^1$H NMR (500 MHz, 1,2-dichlorobenzene-d$_4$, 110° C.) δ (ppm): 8.72 (m, 2H), 8.12 (s, 1H), 2.09 (m, 4H), 1.21-0.90 (m, 18H), 0.86-0.66 (m, 12H).

Figure 11B:
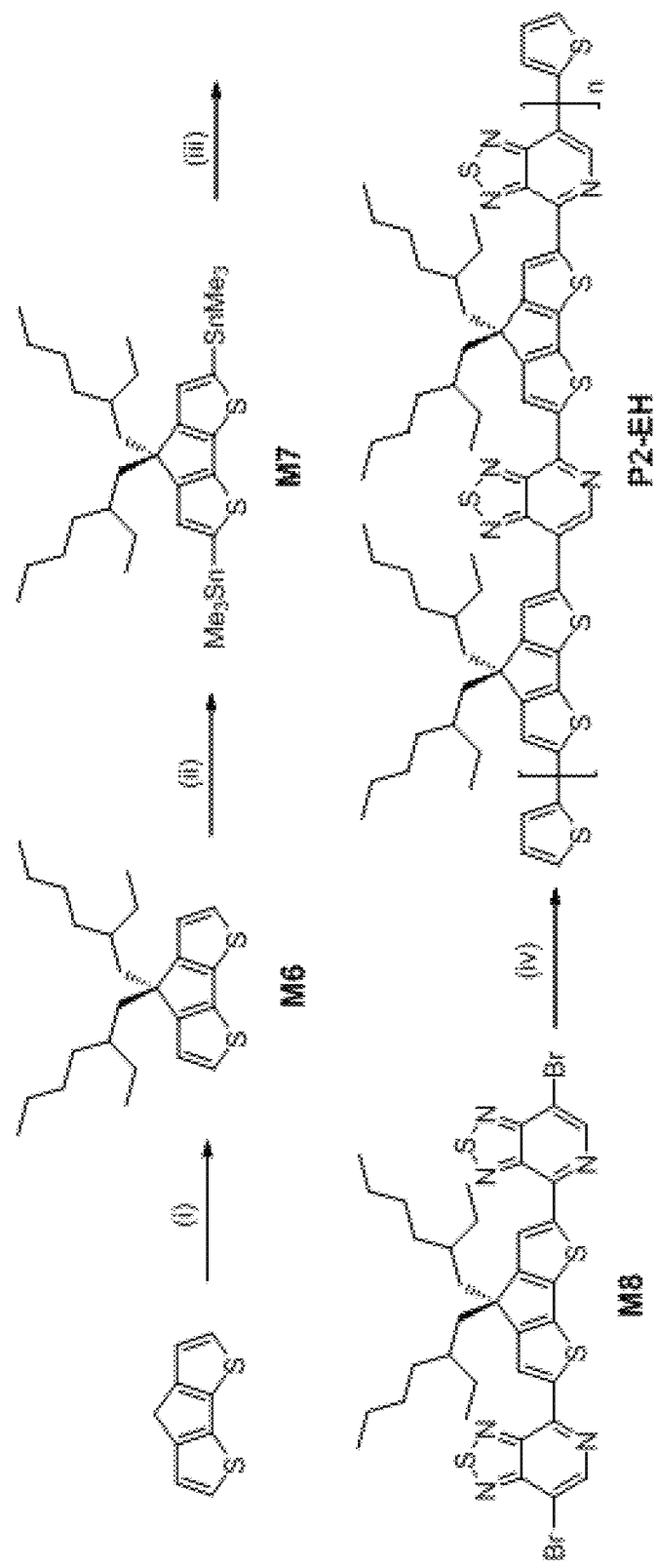
FIG. 11B provides a scheme for a synthetic route for making the polymer designated P2.

FIG. 11B provides a schematic of a synthetic route for P2. Steps shown in FIG. 11B include: (i) (i) 2-Ethylhexylbromide, KOH/KI, DMSO, 60° C. for 8 hrs, 80%; (ii) t-BuLi, THF, −78° C. for 1 hr and 25° C. for 3 hrs, then Me$_3$SnCl at −78° C. for 1 hr and 25° C. for 8 hrs, 96%; (iii) 4,7-dibromo-[1,2,5]thiadiazolo[3,4-c]pyridine, Pd(PPh$_3$)$_4$, toluene, microwave 170° C. for 40 mins, 92%; (iv) M7, Pd(PPh$_3$)$_4$, xylenes, MW 170° C. for 40 mins, 86%.

Results and Discussion

Figure 1B:
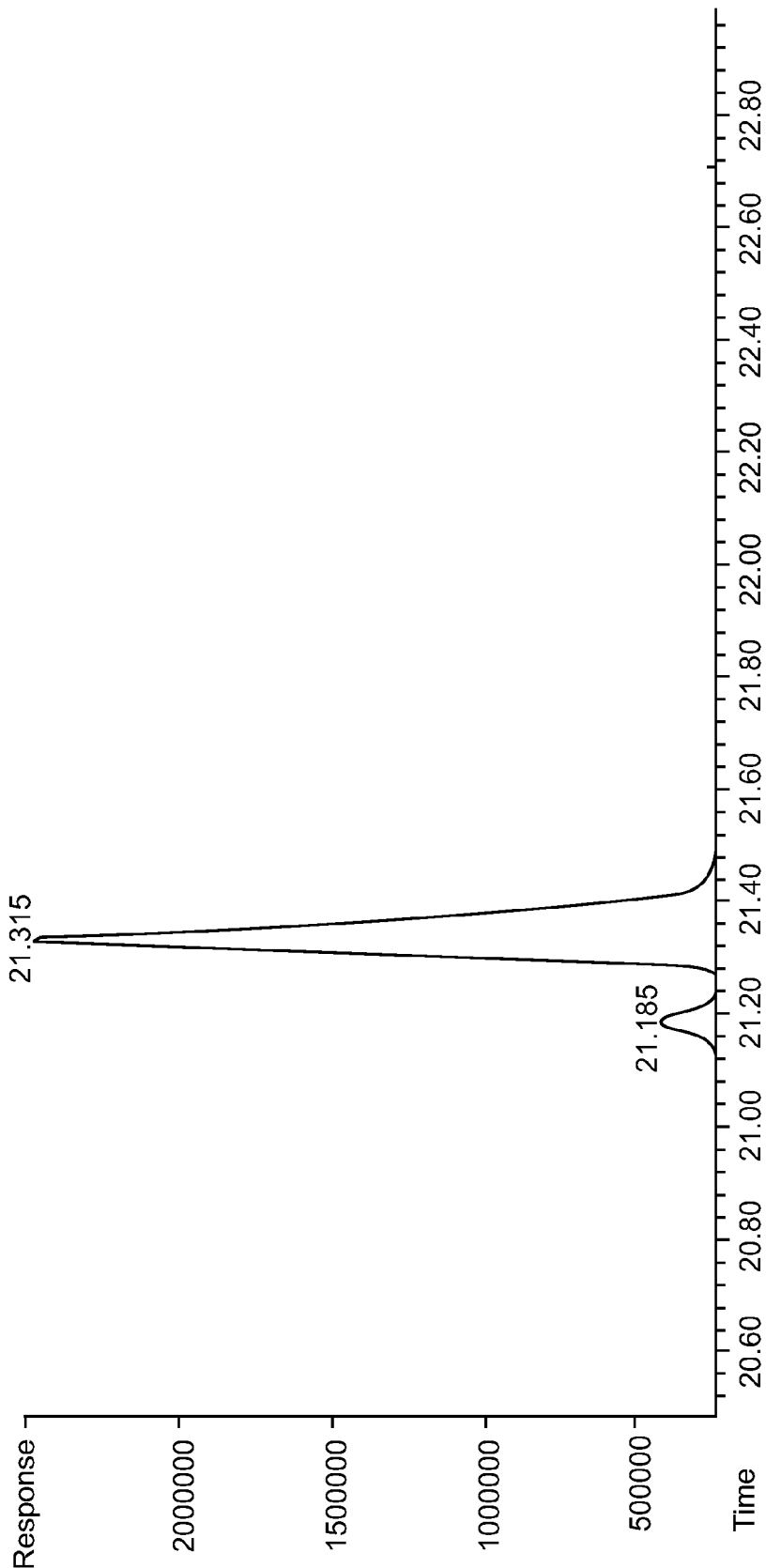

Chiral 2-(S)-ethylhexy-1-ol (M1) was prepared as described in Scheme 1 (FIG. 11A) with the reduction of 2-ethylidenehexanal by yeast. The separation of M1 with the by-product 2-ethylidenehexan-1-ol was tedious and column separation was not suitable because of similar polarity on thin layer chromatography (TLC) plates. Therefore, meta-chloroperoxybenzoic acid (MCPBA) was employed to transfer the by-product to an oxirane-containing structure, which gives a different relative R$_f$ ratio on TLC plates. The impurity could then be separated by flash column chromatography with CH$_2$Cl$_2$/pentane (1/1 in v/v) as eluent. The treatment of M1 with freshly prepared bis(4-bromophenyl)(phenyl)phosphine in dried methylene chloride afforded chiral (S)-2-ethylhexylbromide (M2) in a yield of 90%. Chiral GC indicated a retention time at 21.185 min (R—, 5.25%) and 21.315 min (S—, 94.75%), respectively (see FIG. 1). Therefore the enantiomeric excess (e.e) value was calculated to be 90%, demonstrating that (S)-2-ethylhexylbromide is quite rich in the product.

Figure 2:
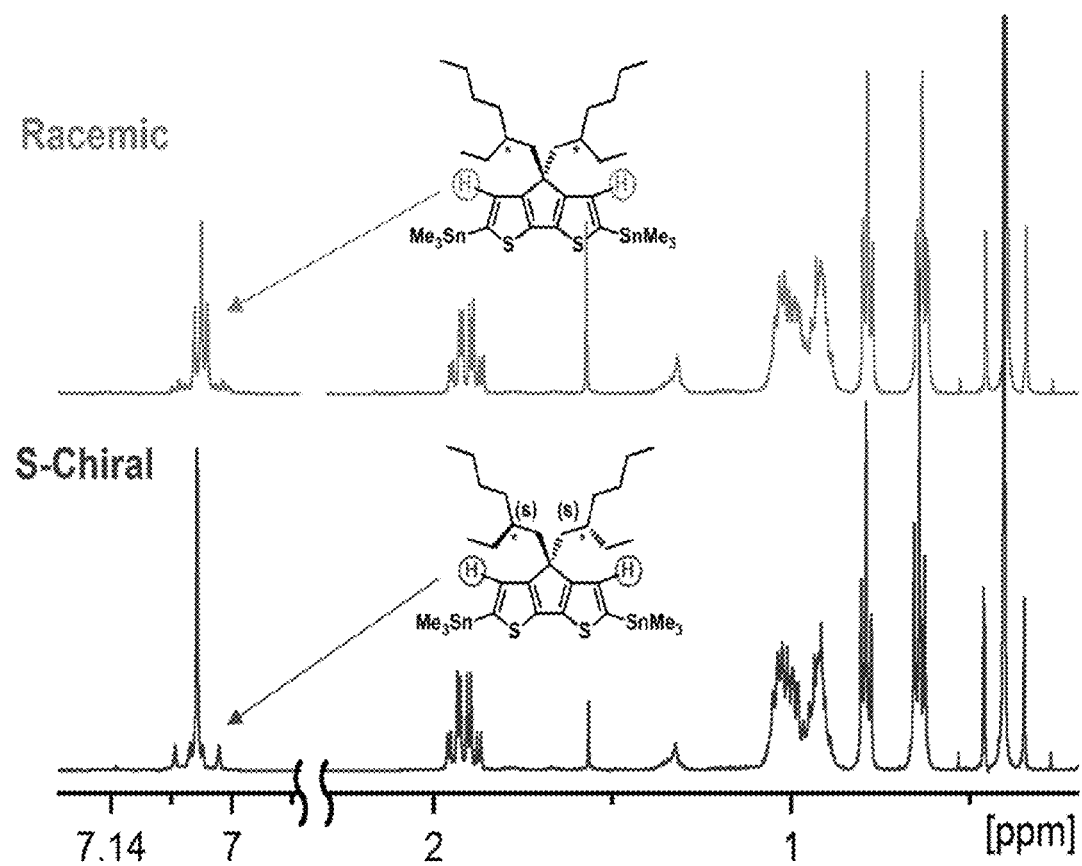
FIG. 2 is a panel of NMR spectra of $^1$H NMR M4 (with chiral side chain) and M7 (with racemic side chain).

A standard alkylation procedure of 4H-cyclopenta[1,2-b:5,4-b']dithiophene (CDT) with M2 afforded M3 with a yield of 80%. However, chiral HPLC in both normal and reverse phase failed to show distinct separation for M3, so the exact e.e. value could not be evaluated for this compound. Monomer M4 could be synthesized by treatment with t-butyl-lithium (t-BuLi) and trimethyltin chloride (Me$_3$SnCl) subsequently. Even though the chiral 2-ethylhexyl side chain was not differentiated by $^1$H NMR spectra (FIG. 2), the proton in the CDT unit shows a different shape in the bisstannyled CDT with the racemic side chain (M7) compared to the chiral side chain (M4).

The regioselective reaction of monomer M4 with 2 equivalents of 4,7-dibromo-[1,2,5]thiadiazolo[3,4-c]pyridine (PTBr$_2$) resulted in the bisbromo compound M5 with structure of Br-PT-CDT-PT-Br in a high yield of 96%. For comparison, the bisstannyled monomer M7 and Br-PT-CDT-PT-Br monomer M8, which are based on racemic 2-ethylhexyl side chains, were also prepared side-by-side under the same reaction conditions as for M4 and M5, respectively. The microwave-assisted copolymerization of monomers M4 and M5, and M7 and M8 gave regioregular copolymer P2S with chiral (S)-2-ethylhexyl side chains, and P2 with racemic 2-ethylhexyl side chains, respectively. It should be noted that the repeat unit of each copolymer contains two CDT-PT units, with both N-atoms from the PT units facing the same CDT moiety. Based on our previous work, such well-controlled regioregular structures of P2S could impart much larger hole mobility and better charge delocalization compared to their regiorandom counterparts. Both of the copolymers were end-capped by a thiophene group to remove end-group defects, and purified by Soxhlet extraction with methanol (12 hrs), acetone (12 hrs), hexane (12 hrs) and chloroform (2 hrs). High temperature gel permeation chromatography (GPC) at 150° C. with 1,2,4-trichlorobenzene as eluent indicated a number molecular weight (M$_n$) of 35 k and a polydispersity (PDI) of 1.9 for P2S, and 37 k and 1.9, respectively, for P2. The differential scanning calorimetry (DSC) test up to 300° C. did not give distinct transition characteristics for either copolymer.

Figure 3:
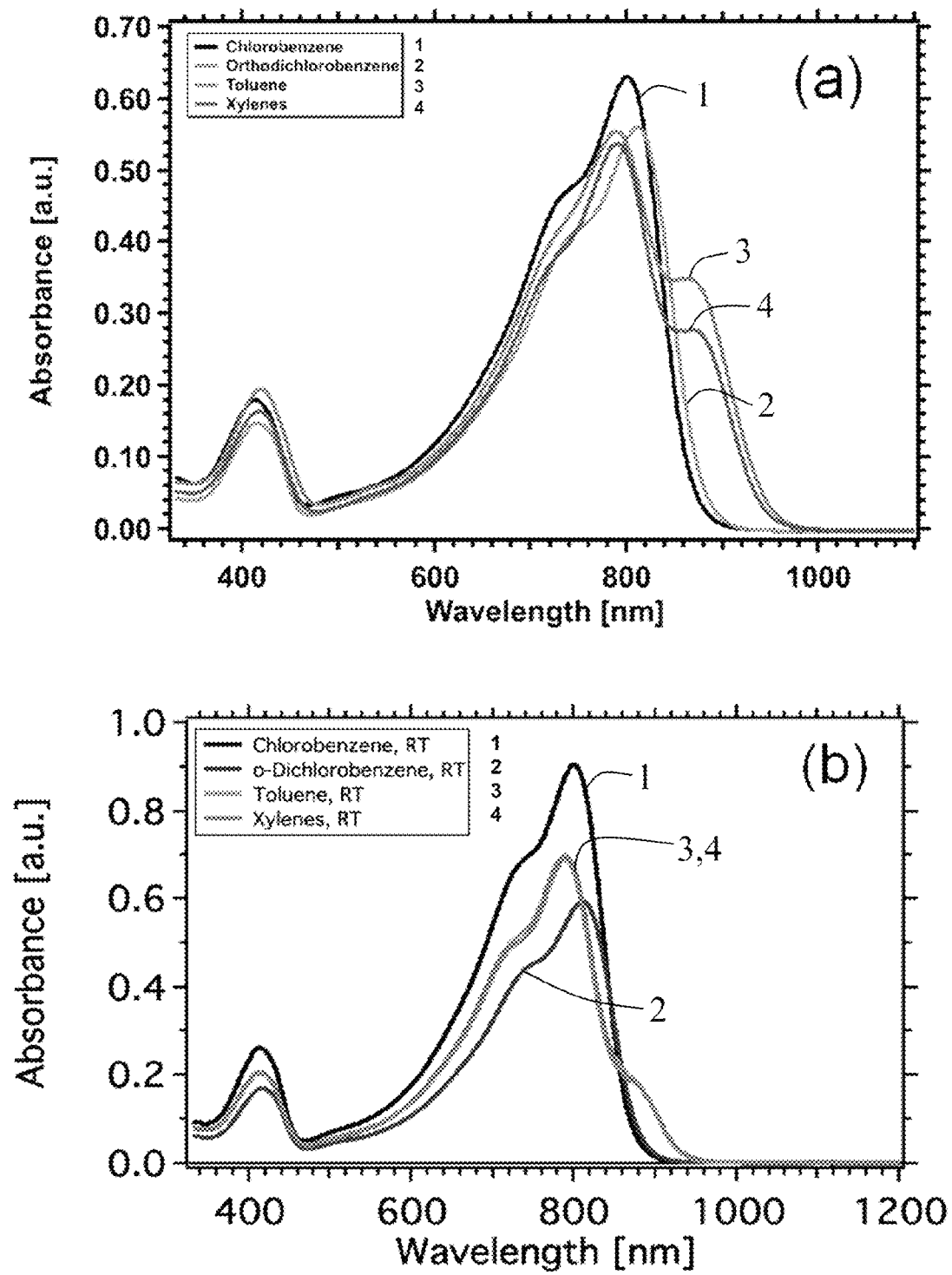
FIG. 3 is a panel of UV-vis profiles of P2S (a) and P2 (b) at room temperature with concentration of $6.7\times10^{-3}$ mg/mL.

FIG. 3 shows the UV-vis absorption for both copolymers in various solvents. Both copolymers show very similar profiles in chlorobenzene and ortho-chlorobenzene. However, distinct aggregation signals, corresponding to a shoulder at 900 nm, were recognized for both copolymers in toluene and xylenes solution. It should be noted that, the aggregation signals for P2S in toluene and xylenes solution (FIG. 3a) are comparatively stronger than that of P2 (FIG. 3b), which might indicate that the S-chiral 2-ethylhexyl side chain in P2S will facilitate the formation of ordered secondary structures.

Figure 4:
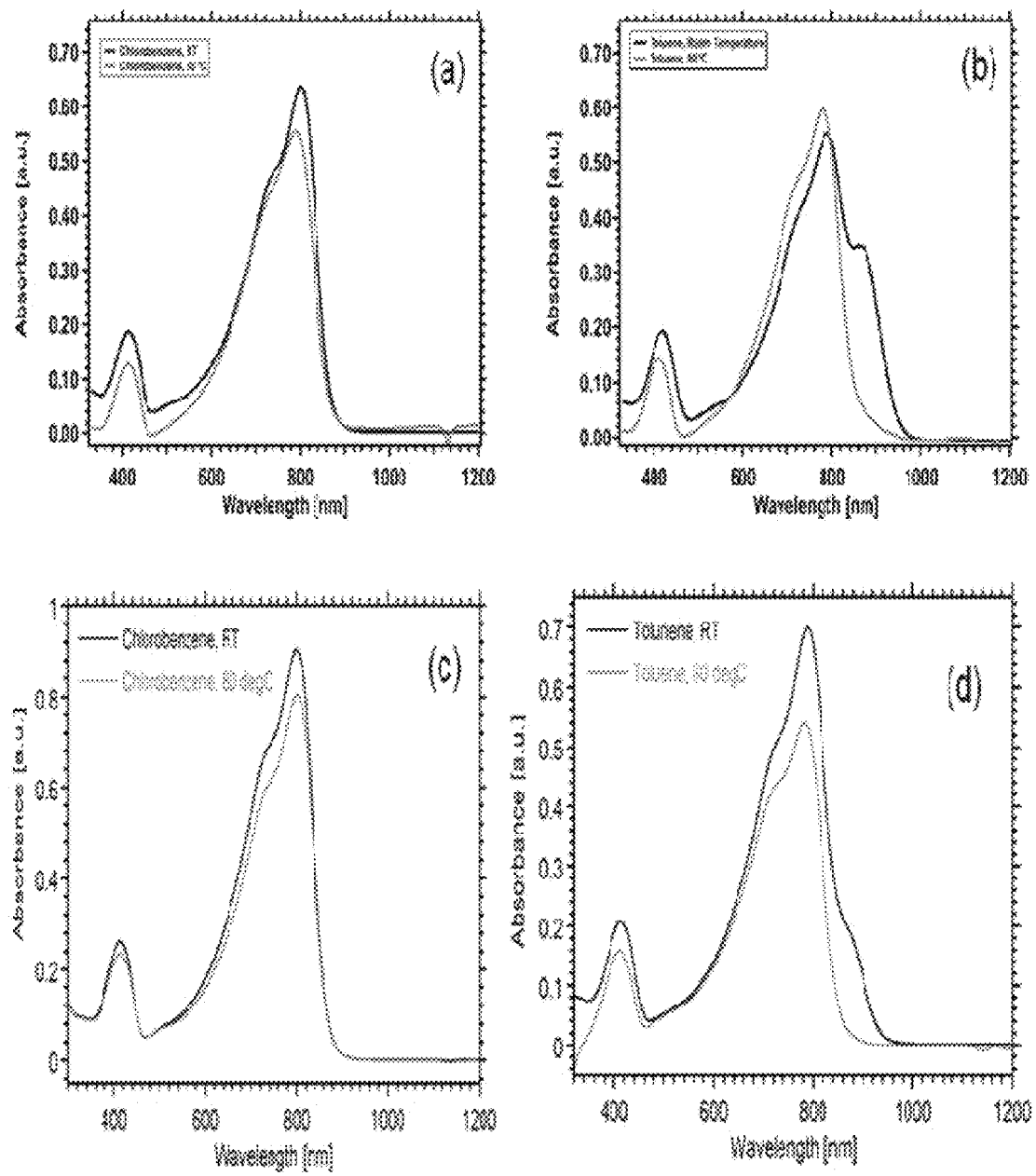
FIG. 4 is a panel of UV-vis profiles showing the effects of temperature on UV-vis of (a) P2S in chlorobenzene, (b) P2S in toluene, (c) P2 in chlorobenzene and (d) P2 in toluene with concentration of $6.7\times10^{-3}$ mg/mL.

As can be seen in FIG. 4a, an almost identical absorption profile was realized for P2S in chlorobenzene solution at both room temperature and high temperature (80° C.), indicating that cholorbenzene is a good solvent for P2S and the molecular main chain was well-extended even at room temperature. However, for a less soluble solvent such as toluene (FIG. 4b), a strong aggregation signal at the shoulder of the absorption profiles at about 900 nm was observed, which disappeared after heating to high temperature of 80° C. Similar phenomena were found for the racemic polymer P2 as shown in FIGS. 4c and 4d, while the difference that the aggregation signal in toluene at room temperature is much lower than that of P2S.

Figure 5:
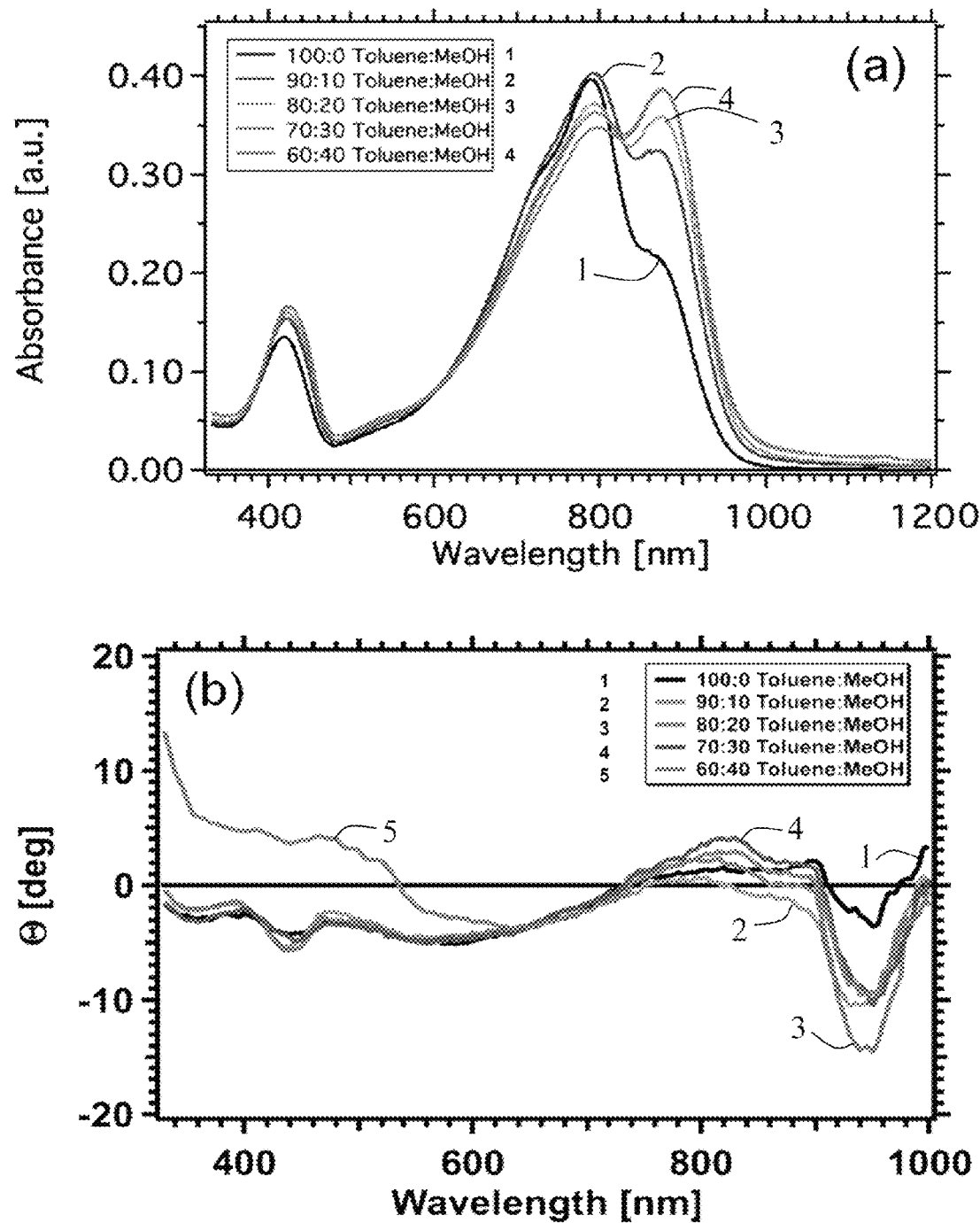
FIG. 5 is a panel of (a) UV-vis profiles of P2S in Toluene: MeOH mixtures with concentration of $6.7\times10^{-3}$ mg/mL, and (b) CD spectra of P2S in toluene:MeOH mixture.

To get the more effective aggregation of P2S in solution, we focused on the less soluble solvent toluene mixed with MeOH. With an increase in MeOH content, the peak at ~800 nm downshifted slightly while the aggregation peak located at ~900 nm increased gradually (FIG. 5a), indicating potentially more ordered-microstructures might be formed. Circular chroism (CD) investigation (FIG. 5b) provides further evidence of the possible formation of an ordered secondary structure of the enantiopure P2S. The CD curves are generally weak, but still show some positive and negative signals close to the position of UV-vis absorption. The relatively strong signals at ~940 nm become gradually stronger with the improvement in MeOH content from 0:100 to 20:80. However, further increasing the MeOH content causes the crush out of polymer from the solution, so the signals then become lower.

Figure 6:
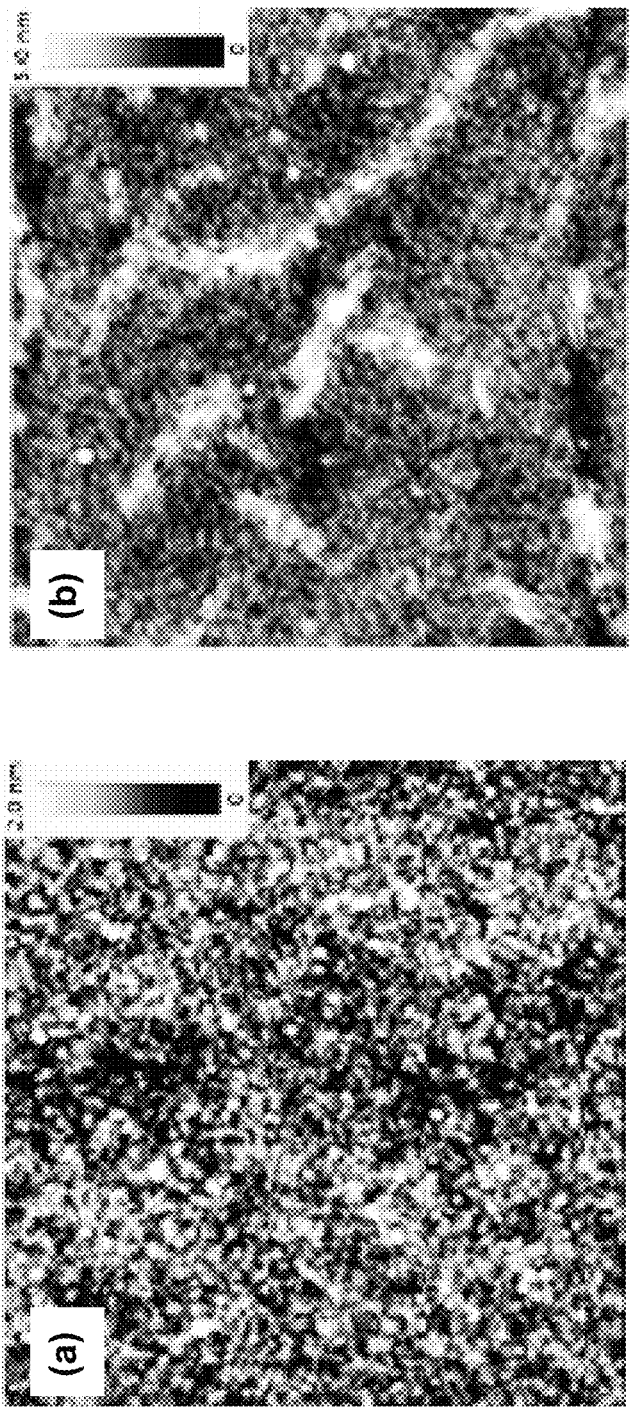
FIG. 6 is a panel of tapping mode AFM height images (1 μm×1 μm) of (a) P2 and (b) P2S spin-coating from 0.25 wt % chlorobenzene solution on the top of Si/SiO$_2$/OTS8 substrate.
Figure 8:
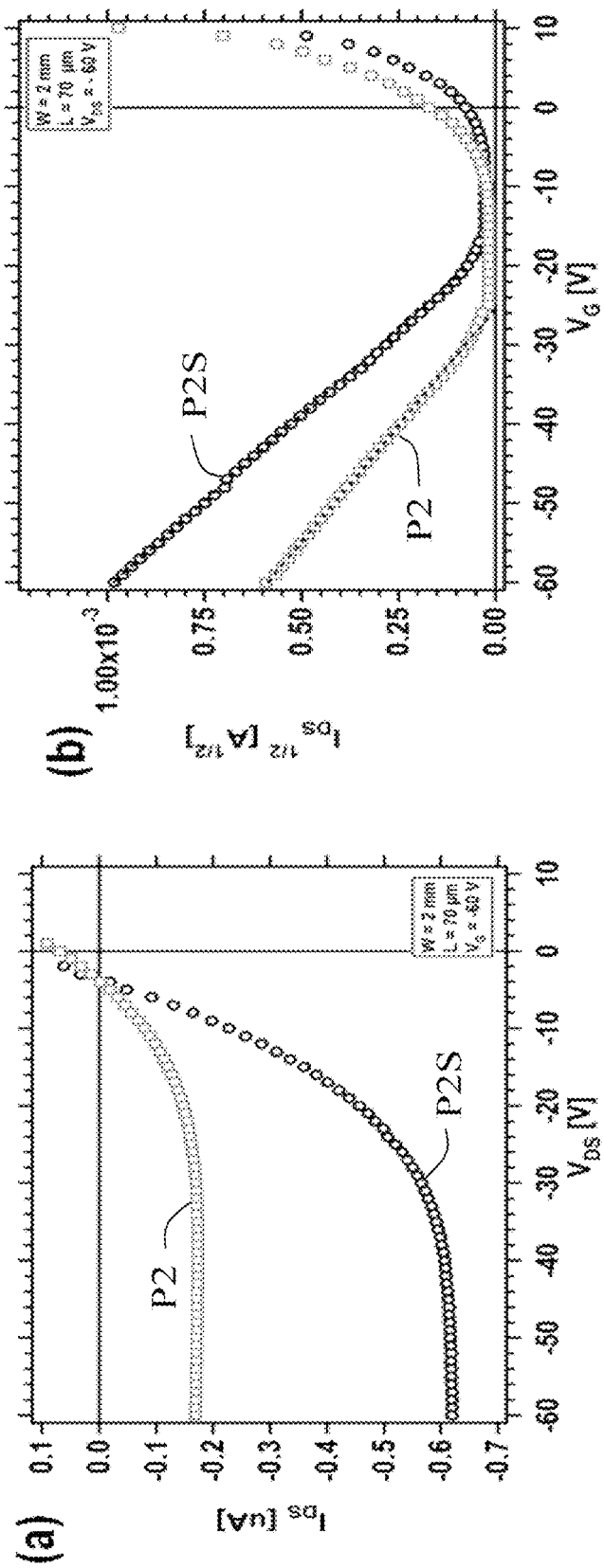
FIG. 8 is a panel showing field-effect transistor characteristics of P2 (red open squares) and P2S (black open circles) spin-coated from 0.25 wt % chlorobenzene solution on OTS8 treated Si/SiO$_2$ substrates (L=70 μm, W=2 mm): (a) output curves taken at $V_G$=−60 V; (b) transfer curves displaying the saturation regime with $V_{DS}$=−60 V. The mobility values were extracted using fits of equation 1 to the curves in FIG. 8b.

Atomic force microscopy (AFM) analysis was carried out to determine if the chirality of the side-chain can significantly influence the surface morphology of solution processed films. Though the absorption spectra of chlorobenzene solutions containing P2 and P2S are very similar, the surface topology is drastically different. FIG. 8 shows the surface topology of P2 (FIG. 6a) and P2S (FIG. 6b) films cast using the same conditions atop OTS8 treated $SiO_2$. It is clear that the surface topology of P2S shows some fiber-like structure (RMS roughness=0.69 nm), whereas the topology of P2 seems to be featureless and completely amorphous (RMS roughness=0.39 nm). The fiber-like structures on the surface of the P2S film are 85 nm wide.

Figure 7:
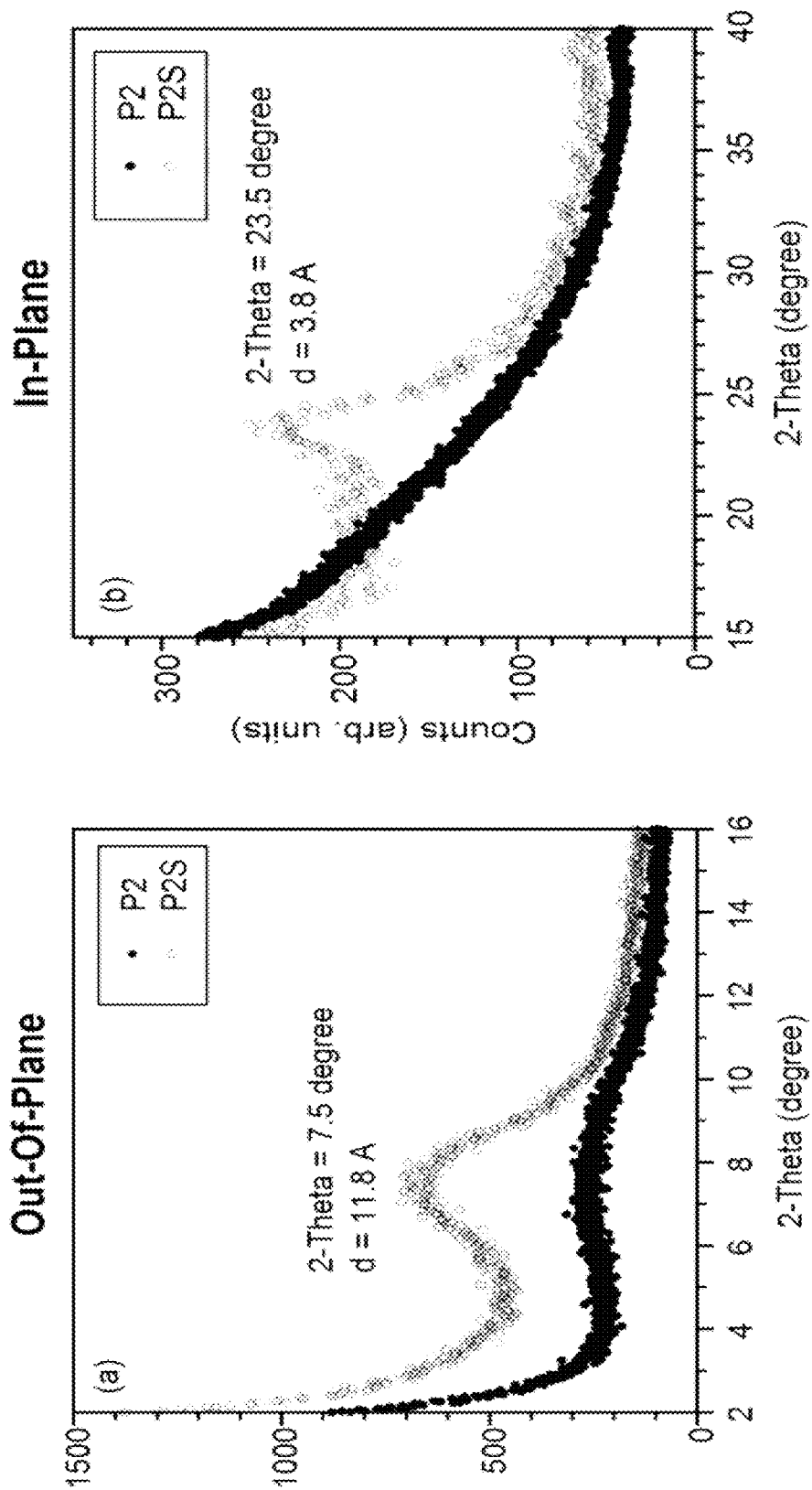
FIG. 7 is a panel of grazing incident wide-angle X-ray scattering profiles of out-of-plane (a) and in-plane (b) for drop casting polymer films from 0.5 wt % chlorobenzene.

The facilitation of enantiopure chiral 2-ethylhexyl side chain on the formation of microstructures was further investigated by Grazing incident wide-angle X-ray scattering (GI-WAXS) profiles. As can be seen in FIG. 7a, the P2S profile shows a strong peak with 2θ=7.5°, corresponding to an inter-plane distance of 11.8 Å, while only weak diffraction is observed for polymer P2 with racemic side chains. The in-plane scattering (FIG. 7b) exhibited a comparatively strong π-π stacking signal for P2S, with the 2θ=23.5°, corresponding to an inter-plane distance of 3.8 Å, while only a featureless profile was observed for the P2 film prepared under the same conditions.

Figure 9:
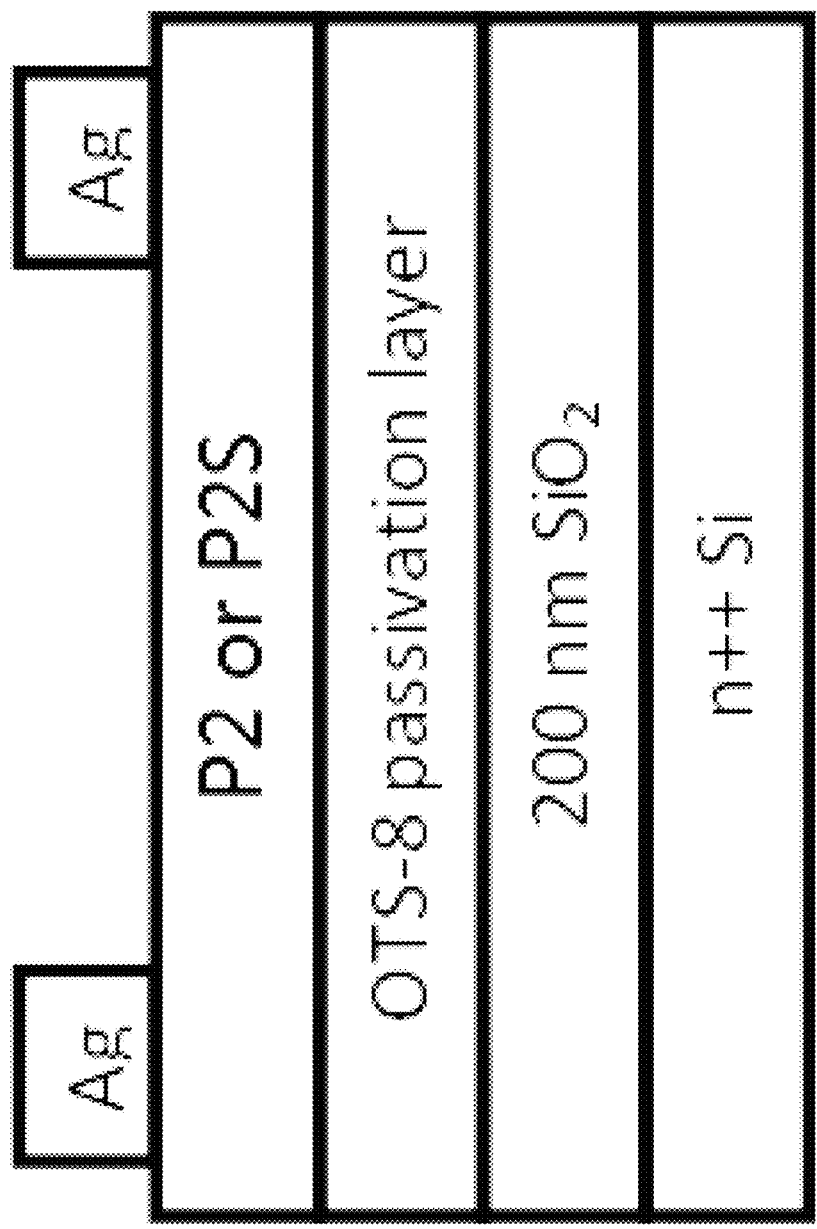
FIG. 9 is a schematic drawing of a bottom-gate, top-contact field-effect transistor including regioregular P2S with (S)-2-ethylhexyl chiral side chain or P2.

Bottom-gate, top-contact field-effect transistors were fabricated so that the difference in charge transport properties of the two materials could be examined. Devices were fabricated using substrates $n^{++}$ doped Si as the gate electrode and 150 nm of thermally grown $SiO_2$ serving as the gate dielectric. The $SiO_2$ was treated with octyltrichlorosilane in order to neutralize traps that may be present on the gate dielectric interface and to change the surface energy at the polymer-gate dielectric interface. The active layers were processed from 0.25% w/v solutions of either P2 or P2S in chlorobenzene, which were spin-coated atop the substrates. The devices were thermally annealed at 80° C. for 10 minutes before thermal deposition of the 60 nm thick Au source-drain electrodes. The electrode width was 2 mm, while the channel length was 70 μm. An example of a device is shown in FIG. 9. An OTS-8 passivation layer was deposited onto the Si/SiO2 wafer, then P2 or P2S was spin-coated on the top of the OTS-8 layer, and then an electrode was deposited on the top of the P2 or P2S layer.

According to their p-type output characteristics (FIG. 8a), P2S shows about 3.7 times higher drain currents in the saturation regime compared to P2. The p-type transfer characteristics are also different between P2 and P2S devices. This data is shown in FIG. 8b. In the saturation regime ($V_{DS}$=−60 V), transfer curves were fit to the following equation:

$$\mu_{sat}(V_g) = \frac{\partial I_{ds,sat}}{\partial V_g} \frac{L}{WC_i} \frac{1}{V_g - V_{Th}} \quad \text{(Equation 1)}$$

where $I_{ds}$ is the drain-source current in the saturation regime, $V_g$ is the gate voltage, L is the channel length, W is the channel width, $C_i$ is the capacitance of the dielectric, and $V_{Th}$ is the threshold voltage. Fits of the transfer curves is shown in FIG. 8b and appear as dotted lines.

In the saturation regime, P2S has a slightly higher hole mobility ($4.0 \times 10^{-3}$ cm²/Vs) than P2 ($1.0 \times 10^{-3}$ cm²/Vs). Additionally, P2S has a smaller threshold voltage of 16 V, compared to 25 V of P2. These observations may correlate with the significant differences seen in the surface topologies for P2 and P2S.

In this work, we report for the first time on the preparation of CDT-PT based regioregular copolymers with enantiopure 2-ethylhexyl as alkyl side chain, and utilize the resulting enantiopure polymer as an active layer in organic FETs. Our results indicate that devices based on the enantiopure polymer can exhibit three times greater hole mobility than devices based on racemic counterparts of the polymer.

The following publications are incorporated by reference herein: L. A. P. Kane-Maguire and G. G. Wallace, *Chem Soc Rev*, 2010, 39, 2545; J. J. L. M. Cornelissen, A. E. Rowan, R. J. M. Nolte and N. A. J. M. Sommerdijk, *Chem Rev*, 2009, 101, 4039; L. Pu, *Acta Polym*, 1997, 48, 116; M. Oda, H.-G. Nothofer, U. Scherf, V. Sunjic, D. Richter, W. Regenstein and D. Neher, *Macromolecules*, 2002, 35, 6792; K. Van den Bergh, I. Cosemans, T. Verbiest and G. Koeckelberghs, *Macromolecules*, 2010, 43, 3794; S. Vandeleene, M. Jivanescu, A. Stesmans, J. Cuppens, M. J. Van Bale, T. Verbiest, G. Koeckelberghs, *Macromolecules*, 2011, 44, 4911; Y. S. Jeong and K. Akagi, *Macromolecules*, 2011, 44, 2418; C. R. G. Grenier, S. J. George, T. J. Joncheray, E. W. Meijer, and J. R. Reynolds *J. Am. Chem. Soc.* 2007, 129, 10694; and U.S. Pat. Nos. 8,318,532, 8,383,761, 8,394,917 and 8,404,800.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the invention and the following claims.

What is claimed is:

1. A regioregular conjugated polymer having a main chain comprising a repeat unit including a dithiophene of the formula:

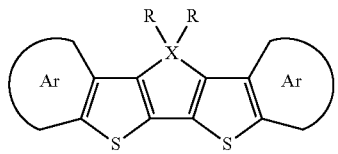

and a pyridine of the formula:

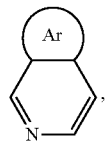

wherein:
each Ar is independently nothing or a substituted or non-substituted aromatic functional group, each R is independently nothing or an enantiopure or enantioenriched substituted or non-substituted chiral alkyl or chiral alkoxy chain, and X is C, Si, Ge, N or P; and the polymer comprises a donor-acceptor conjugated polymer including a plurality of donor repeating units and a plurality of acceptor repeating units.

2. The regioregular conjugated polymer of claim 1, wherein the substituted or non-substituted aromatic functional group includes one or more alkyl chains.

3. The regioregular conjugated polymer of claim 2, wherein the one or more alkyl chains are each independently a $C_6$-$C_{30}$ substituted or non-substituted alkyl chain, —(CH$_2$CH$_2$O)n— (n=2-20), $C_6H_5$, —$C_nF_{(2n+1)}$ (n=2-20), —(CH$_2$)$_n$N(CH$_3$)$_3$Br (n=2-20), or —(CH$_2$)$_n$N(C$_2$H$_5$)$_2$ (n=2-20).

4. The regioregular conjugated polymer of claim 1, wherein the pyridine unit is of the following formula:

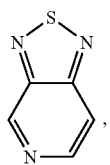

and the dithiophene unit is of the following formula:

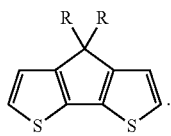

5. The regioregular conjugated polymer of claim 1, wherein the conjugated main chain comprises a repeat unit of the following formula:

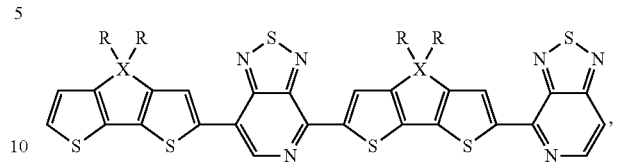

wherein each R is independently nothing or an enantiopure or enantioenriched substituted or non-substituted chiral alkyl or alkoxy chain, and X is C, Si, Ge, N or P.

6. The regioregular conjugated polymer of claim 5, wherein the repeat unit has the following formula:

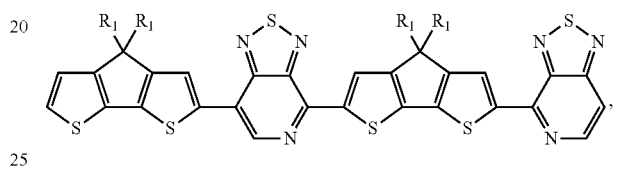

wherein each $R_1$ is independently nothing or an enantiopure or enantioenriched substituted or non-substituted chiral alkyl or alkoxy chain.

7. The regioregular conjugated polymer of claim 1, wherein the enantiopure or enantioenriched substituted or non-substituted chiral alkyl or alkoxy chain is a $C_6$-$C_{30}$ substituted or non-substituted chiral alkyl or alkoxy chain, or enantiopure or enantioenriched (S)-2-methylbutyl, (S)-2-ethylhexyl, (S)-5,7-dimethyloctyl, (S)-2-methylbutoxyl, (S)-(2-ethylhexyl)oxyl, (S)-(5,7-dimethyloctyl)oxyl, (R)-2-methylbutyl, (R)-2-ethylhexyl, (R)-5,7-dimethyloctyl, (R)-2-methylbutoxyl, (R)-(2-ethylhexyl)oxyl, or (R)-(5,7-dimethyloctyl)oxyl.

8. The regioregular conjugated polymer of claim 1, wherein the charge carrier mobility of the polymer is greater than the charge carrier mobility of a polymer of similar regioregularity and composition but having a racemic substituted or non-substituted chiral alkyl or alkoxy chain.

9. The regioregular conjugated polymer of claim 1, wherein the polymer exhibits at least one of the following properties as compared to a control regioregular conjugated polymer wherein R is not an enantiopure or enantioenriched substituted or non-substituted chiral alkyl or chiral alkoxy chain:
an electron hole mobility that is at least 10% greater than the electron hole mobility of the control regioregular conjugated polymer; or
a threshold voltage that is at least 10% less than a threshold voltage of the control regioregular conjugated polymer.

10. A method of forming an organic semiconductor film, the method comprising the steps of forming a regioregular conjugated polymer by:
selecting monomers comprising an enantiopure or enantioenriched chiral side groups, wherein the monomers are selected to form a donor-acceptor conjugated polymer comprising a plurality of donor repeating units and a plurality of acceptor repeating units; and
performing a polymerization reaction on the monomers so as to produce a polymer that comprises a regioregular conjugated main chain section having enantiopure or enantioenriched chiral side chains.

11. The method of claim 10, wherein the method comprises regioselectively preparing the monomers prior to the polymerization reaction.

12. The method of claim 11, wherein regioselectively preparing the monomers comprises reacting halogen-functionalized thiadiazolo[3,4-c]pyridine with organotin-functionalized cyclopenta[2,1-b:3,4-b']dithiophene comprising an enantiopure or enantioenriched chiral side group.

13. The method of claim 12, wherein the organotin-functionalized cyclopenta[2,1-b:3,4-b']dithiophene has the following formula:

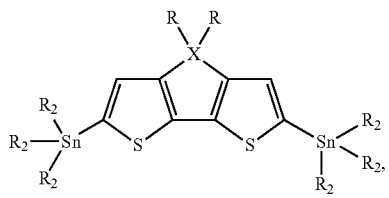

wherein each R is independently nothing or an enantiopure or enantioenriched substituted or non-substituted chiral alkyl or alkoxy chain, each $R_2$ is independently methyl or n-butyl, and X is C, Si, Ge, N or P.

14. The method of claim 13, wherein the monomer comprises the formula:

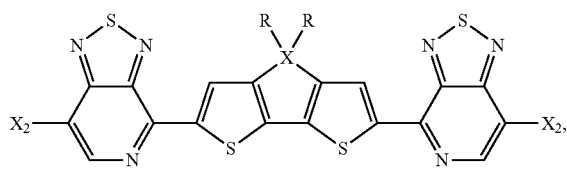

wherein each R is independently nothing or an enantiopure or enantioenriched substituted or non-substituted chiral alkyl or alkoxy chain, X is C, Si, Ge, N or P, and each $X_2$ independently comprises a halogen.

15. The method of claim 14, wherein the monomer has the following formula:

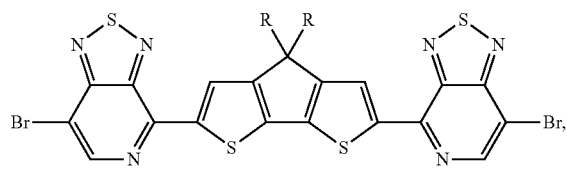

wherein each $R_1$ is independently nothing or an enantiopure or enantioenriched substituted or non-substituted chiral alkyl or alkoxy chain.

16. A device comprising a composition of matter including regioregular conjugated polymer having a main chain comprising a repeat unit including a dithiophene of the formula:

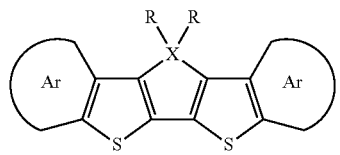

and a pyridine of the formula:

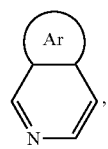

wherein:
each Ar is independently nothing or a substituted or non-substituted aromatic functional group, each R is independently nothing or an enantiopure or enantioenriched substituted or non-substituted chiral alkyl or alkoxy chain, and X is C, Si, Ge, N or P; and
the polymer forms a donor-acceptor conjugated polymer comprising a plurality of donor repeating units and a plurality of acceptor repeating units.

17. The device of claim 16, wherein the regioregular polymer forms an active semiconducting layer.

18. The device of claim 17, wherein a threshold voltage of the device is at least 10% less than a threshold voltage of a similar device containing a polymer of similar regioregularity and composition but having a racemic substituted or non-substituted chiral alkyl or alkoxy chain.

19. The device of claim 16, wherein the polymer exhibits at least one of the following properties as compared to a control regioregular conjugated polymer wherein R is not an enantiopure or enantioenriched substituted or non-substituted chiral alkyl or chiral alkoxy chain:
an electron hole mobility that is at least 10% greater than the electron hole mobility of the control regioregular conjugated polymer; or
a threshold voltage that is at least 10% less than the threshold voltage of the control regioregular conjugated polymer.

20. The device of claim 16, wherein the device is a field effect transistor, organic photovoltaic device, polymer light emitting diode, organic light emitting diode, organic photodetector, or biosensor.

* * * * *